United States Patent [19]
Wittig et al.

[11] Patent Number: 6,150,838
[45] Date of Patent: Nov. 21, 2000

[54] FPGA CONFIGURABLE LOGIC BLOCK WITH MULTI-PURPOSE LOGIC/MEMORY CIRCUIT

[75] Inventors: Ralph D. Wittig, Menlo Park; Sundararajarao Mohan, Cupertino; Richard A. Carberry, Los Gatos, all of Calif.

[73] Assignee: Xilinx, Inc., San Jose, Calif.

[21] Appl. No.: 09/258,024

[22] Filed: Feb. 25, 1999

[51] Int. Cl.[7] .................................................. G06F 7/38
[52] U.S. Cl. ................................. 326/39; 326/41; 326/38
[58] Field of Search .................................. 326/38, 39, 41

[56] References Cited

U.S. PATENT DOCUMENTS

| | | | |
|---|---|---|---|
| 5,362,999 | 11/1994 | Chiang | 326/44 |
| 5,432,719 | 7/1995 | Freeman et al. | 364/579 |
| 5,473,267 | 12/1995 | Stansfield | 326/41 |
| 5,801,547 | 9/1998 | Kean | 326/40 |
| 5,828,229 | 10/1998 | Cliff et al. | 326/40 |
| 6,020,759 | 2/2000 | Heile | 326/40 |

FOREIGN PATENT DOCUMENTS

0913944A2  5/1999  European Pat. Off. .

OTHER PUBLICATIONS

"SMAP: Heterogenous Technology Mapping for Area Reduction in FPGAs with Embedded Memory Arrays", by Steve J. E. Wilton, published Feb. 1998, ACM/SIGDA International Symposium on Field–Programmable Gate Arrays.

*Primary Examiner*—Michael Tokar
*Assistant Examiner*—Anh Q. Tran
*Attorney, Agent, or Firm*—Patrick T. Bever, Esq.; Bever, Hoffman & Harms; Lois D. Cartier

[57] ABSTRACT

A logic/memory circuit (LMC) utilized in a configurable logic block (CLB) of a programmable logic device (PLD) that implements an eight-input lookup table (LUT) using an array of programmable elements arranged in rows and columns. A decoder is used to read bit values from one column (e.g., sixteen programmable elements) of the array. In one embodiment, a separate read bit line is provided to facilitate faster read operations. A sixteen-to-one multiplexer/demultiplexer circuit is used to pass selected bit values to an output terminal. The array of programmable elements is programmable both from configuration lines during a configuration mode, and by data transmitted on the interconnect resources through the multiplexer/demultiplexer circuit. In one embodiment, the programmable elements of the array are connected in pairs to product term generation circuitry. Product terms generated by the product term circuitry are passed to a macrocell circuit to perform programmable array logic (PAL) logic operations. In another embodiment, a CLB includes four LMCs and a multiplier circuit such that large amounts of logic are locally implemented, thereby avoiding signal delays associated with transmission over general purpose interconnect resources within a PLD.

37 Claims, 23 Drawing Sheets

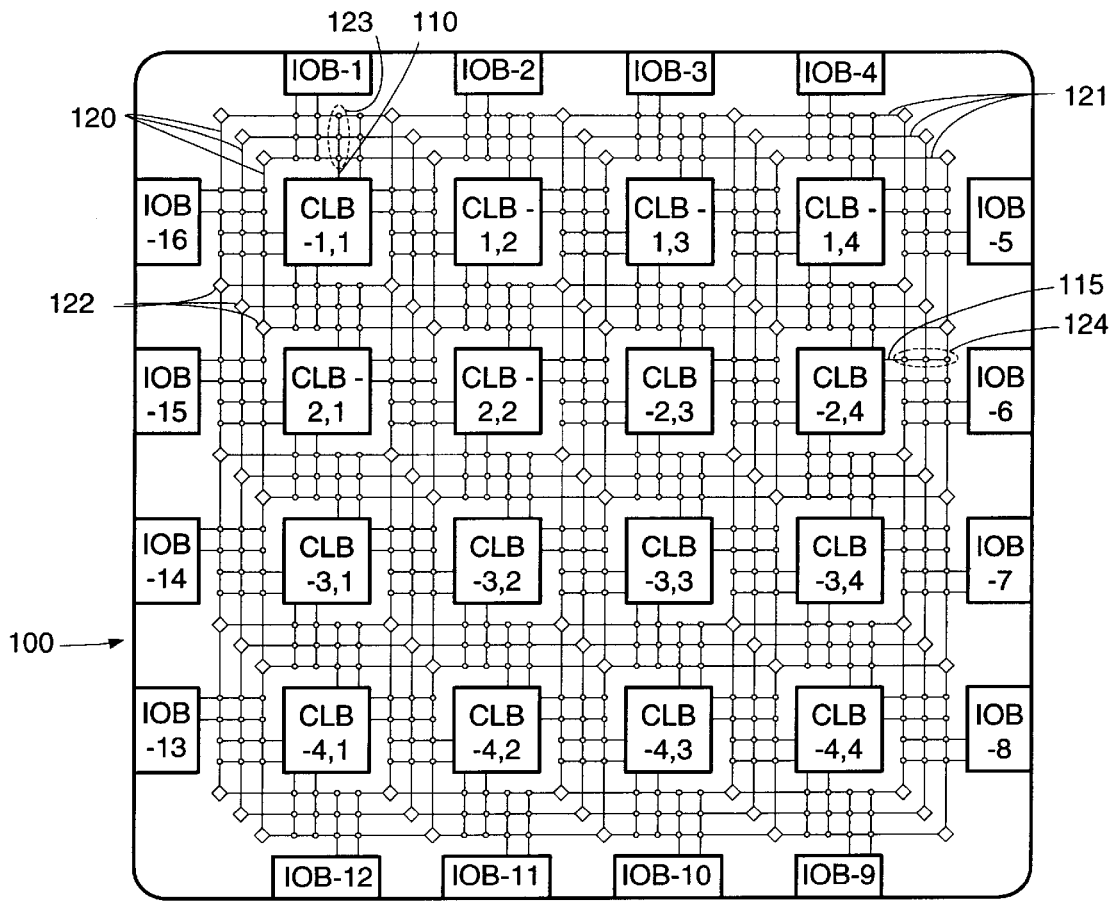
FIG. 1(A)
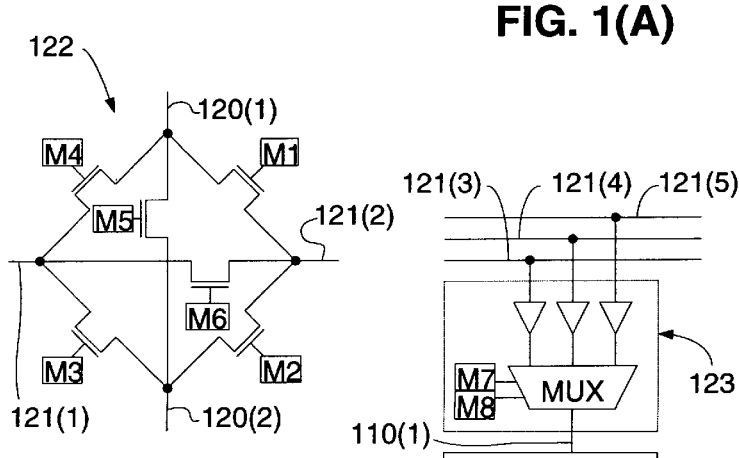
**FIG. 1(B)
(PRIOR ART)**
**FIG. 1(C)
(PRIOR ART)**
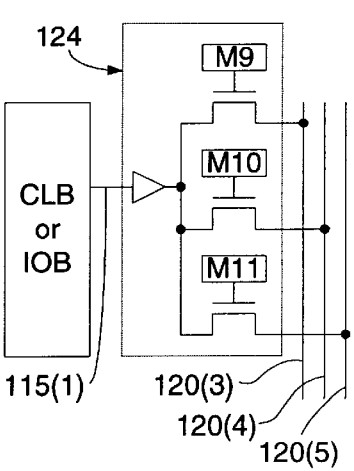
**FIG. 1(D)
(PRIOR ART)**

FPGA CONFIGURABLE LOGIC BLOCK WITH MULTI-PURPOSE LOGIC/MEMORY CIRCUIT

CROSS-REFERENCE TO RELATED APPLICATIONS

This application relates to the following commonly assigned, concurrently filed U.S. patent application Ser. No. 09/258,001 invented by Ralph D. Wittig, Sundararajarao Mohan, and Richard A. Carberry entitled "FPGA CONFIGURABLE LOGIC BLOCK WITH MULTI-PURPOSE LOGIC/MEMORY CIRCUIT",
which is incorporated herein by reference.

FIELD OF THE INVENTION

This invention relates to programmable logic devices, and in particular to configurable logic blocks of field programmable gate arrays.

BACKGROUND OF THE INVENTION

FIG. 1(A) is a simplified diagram showing a basic Field Programmable Gate Array (FPGA) 100, which is a type of Programmable Logic Device (PLD). FPGA 100 includes an array of configurable logic blocks (CLBs) CLB-1,1 through CLB-4,4 surrounded by input/output blocks (IOBs) IOB-1 through IOB-16, and programmable interconnect resources that include vertical interconnect segments 120 and horizontal interconnect segments 121 extending between the rows and columns of CLBs and IOBs. Each CLB includes configurable combinational circuitry and optional output registers programmed to implement a portion of a user's logic function. The interconnect segments of the programmable interconnect resources are configured using various switches to generate signal paths between the CLBs that link the logic function portions. Each IOB is similarly configured to selectively utilize an associated pin (not shown) of FPGA 100 either as a device input pin, a device output pin, or an input/output pin. Although greatly simplified, FPGA 100 is generally consistent with FPGAs that are produced by Xilinx, Inc. of San Jose, Calif.

FIGS. 1(B) through 1(D) are simplified diagrams showing examples of the various switches associated with the programmable interconnect resources of FPGA 100. FIG. 1(B) shows an example of a six-way segment-to-segment switch 122 that selectively connects vertical wiring segments 120(1) and 120(2) and horizontal wiring segments 121(1) and 121(2) in accordance with configuration data stored in memory cells M1 through M6. Alternatively, if horizontal and vertical wiring segments 120 and 121 do not break at an intersection, a single transistor makes the connection. FIG. 1(C) shows an example of a segment-to-CLB/IOB input switch 123 that selectively connects an input wire 110(1) of a CLB (or IOB) to one or more interconnect wiring segments in accordance with configuration data stored in memory cells M7 and M8. FIG. 1(D) shows an example of a CLB/IOB-to-segment output switch 124 that selectively connects an output wire 115(1) of a CLB (or IOB) to one or more interconnect wiring segments in accordance with configuration data stored in memory cells M9 through M11.

Since the first FPGA was invented in the 1980's, variations on the basic FPGA circuitry have been devised that allow FPGAs to implement specialized functions more efficiently. For example, special interconnect lines have been added to allow adjacent CLBs to be connected at high speed and without taking up general interconnect lines. In addition, hardware has been placed between adjacent CLBs that allows fast carry signal transmissions when an FPGA is configured to implement an arithmetic function or certain wide logic functions. Finally, the circuitry associated with the CLBs has undergone several changes that allow each CLB to implement specialized functions more efficiently. Such CLB modifications are particularly relevant to the present invention.

FIG. 2(A) is a simplified schematic diagram showing a prior art CLB 200 used in the XC4000™ series of FPGAs produced by Xilinx, Inc. CLB 200 includes a first four-input lookup table (LUT) F, a second four-input LUT G, a three-input LUT H, a set of LUT output multiplexers (MUXes) 210, optional output registers FF-1 and FF-2, and additional circuitry for routing signals within CLB 200. LUT F receives data input signals F1 through F4 that are transmitted from the interconnect resources of the FPGA. Similarly, LUT G receives data input signals G1 through G4. The operation of LUTs F and G is described in detail below. In addition to the eight data input signals F1 through F4 and G1 through G4, CLB 200 receives a clock signal CLK, and data/control signals H1, DIN/H2, SR/H0, and EC. By selectively configuring the various programmable elements associated with CLB 200, CLB 200 generates output signals in response to the data and control signals that are consistent with an assigned portion of a user's logic function.

FIG. 2(B) is a diagram showing a circuit that can implement four-input LUTs F and G in CLB 200. Each four-input LUT includes a memory circuit 230 having sixteen memory bits M0 through M15 and a MUX structure 240. The programmed state of each of memory bits M0 through M15 is transmitted to MUX structure 240 on lines 235. MUX structure 240 selectively passes the programmed state of one of the memory bits to output terminal 245 in response to the four input signals (either F1 through F4 or G1 through G4). Functionally described, MUX structure 240 includes a series of two-input MUXes controlled by the four input signals. Each combination of four input signals produces a unique address that causes the LUT to output the contents of one of memory bits M0 through M15 of memory circuit 230.

FIG. 2(C) is a simplified circuit diagram showing memory bit M0 of memory circuit 230 (see FIG. 2(B)). Memory bit M0 includes first and second inverters connected end-to-end to form a latch 231 that is connected to BIT and BIT_b (inverted bit) lines via pass transistors 232 and 233, respectively, and a third inverter 234 that is connected between latch 231 and the output line 235-1. Pass transistors 232 and 233 are controlled by a WRITE control line. During a configuration mode, the WRITE line is pulled high and data is transmitted to the latch via the BIT and BIT_b lines. During subsequent operation, the data bit stored by the latch is transmitted through the third inverter 234 and applied to output line 235-1, which transmits the data bit to MUX structure 240.

Four-input LUTs F and G of CLB 200 have proven extremely useful for implementing many logic functions. However, a problem arises when certain large logic functions are implemented that require signal transmission through four or more CLBs.

FIG. 3 is a simplified diagram showing a portion 300 of an FPGA that includes six CLBs. The interconnect resources associated with portion 300 are programmed to provide a signal path 310 for transmitting data signals between selected CLBs. Specifically, signal path 310 defines the transmission path of an input signal transmitted to LUT F of CLB-1,1, the output signal from LUT F of CLB-1,1 that is transmitted to LUT F of CLB-1,2, the output signal from LUT F of CLB-1,2 that is transmitted to LUT G of CLB-2,2, the output signal from LUT G of CLB-2,2 that is transmitted to LUTs G and H of CLB-2,3, and the output signal from LUT H of CLB-2,3.

Signal path 310 represents one of many signal paths typically associated with a user's logic function. Other signal paths are used, for example, to transmit additional input signals to LUT F of CLB-1,1. (These additional signal paths are indicated in an abbreviated manner by the short lines extending from CLB-1,1.) The interconnect resources used by these additional signal paths are not shown, so that signal path 310 is clearly identified.

The various components of the CLBs, IOBs, and interconnect resources of a PLD introduce signal delays that delay signals through the PLD. For example, delays are introduced as the signal passes through the various switches associated with an FPGA (see FIGS. 1(B) through 1(D), discussed above). Even larger delays are typically produced by the propagation of signals through the CLBs of an FPGA. As mentioned above, an output signal from each four-input LUT F/G is passed through four MUXes from a selected memory cell that is addressed by the four input signals. The delay associated with the transmission through the four MUXes of each four-input LUT is approximately 1 nanosecond (ns). Additional delays are subsequently produced by the LUT output MUXes 210.

PLD users often impose timing restrictions on one or more signal paths in a logic function implemented in a target PLD. These timing restrictions, or "constraints", define a maximum period allowed for a signal to propagate along a particular path. A signal path is referred to as a "critical" path if it limits the maximum clock rate of a circuit. Some signals may be transmitted through relatively few CLBs, thereby experiencing a relatively short propagation delay. Conversely, other signals may be transmitted through a relatively large number of CLBs, thereby experiencing a relatively large delay, and one of these signals is often on the critical path. Therefore, it is important to minimize the number of CLBs through which a signal travels along a critical path.

One approach to minimizing the propagation delay associated with signal transmission through multiple CLBs is to provide large general-purpose logic circuits that can implement large portions of a user's logic function. As mentioned above, when the CLBs of an FPGA include small logic circuits (e.g., four-input LUTs), a user's logic function must be partitioned into relatively small logic portions that can be implemented in these small logic circuits. Partitioning a large logic function into multiple small logic portions can cause the failure of one or more paths of the logic function to meet the user's timing constraints. By providing large logic circuits, it is possible for place-and-route software to partition the user's logic function into larger logic portions that can be efficiently implemented in the large logic circuits such that propagation delays are minimized.

Large general-purpose logic circuits have been provided in some PLDs in the form of programmable logic array (PLA) or programmable array logic (PAL) circuits. Unlike LUTs, PLA and PAL circuits utilize AND/OR logic arrangements to implement logic functions. While PLA and PAL circuits typically implement wide logic functions faster than LUTs, they are restricted by this AND/OR logic arrangement. In general, a LUT is capable of implementing more complex logic functions than a PLA and PAL circuit having a comparable size.

What is needed is a CLB for an FPGA that allows the implementation of large logic functions using a LUT logic arrangement while utilizing a limited amount of space. What is also needed is a logic/memory circuit for an FPGA that can be operated as either a LUT or a PLA/PAL, thereby allowing a user to selectively implement portions of a logic function in either of these logic circuit types.

SUMMARY OF THE INVENTION

The present invention is directed to a multi-purpose logic/memory circuit (LMC) utilized in a configurable logic block (CLB) of a programmable logic device (PLD) that can implement both high capacity lookup table (LUT) operations and RAM operations using the same array of programmable elements (memory cells). In some embodiments, the array of programmable elements is also used to perform high-speed programmable array logic (PAL) operations. Because the same array of programmable elements is selectively used for LUT, RAM or PAL operations, the LMC of the present invention provides a highly versatile logic circuit that can implement a user's logic function in a highly efficient manner.

In accordance with one embodiment of the invention, an LMC implements either an eight-input lookup table (LUT) or a 256-bit RAM using the same sixteen-by-sixteen array of programmable elements. A first set of four input signals is used to address a word (i.e., sixteen programmable elements) stored in one column of the array, and a second set of four input signals is used to pass one or more bits from the selected word to a set of output terminals. The resulting eight-input LUT provides substantially greater capacity than prior art sixteen-bit LUTs and, therefore, is capable of implementing substantially larger portions of a user's logic function while taking up minimal additional space. Further, because larger logic functions can be implemented in a single eight-input LUT, the propagation delays associated with signal transmissions between multiple sixteen-bit LUTs can be avoided. Moreover, in one embodiment independent read bit lines are utilized to minimize capacitance during read operations, thereby providing faster operating speeds.

In accordance with another embodiment of the invention, a PAL input signal control circuit is used to transmit input signals directly to the write bit lines of the array. These input signals, along with the bit values stored in the programmable elements, are transmitted to product term generation circuitry that generates product terms. The LMC is also provided with a macrocell that generates a sum-of-products term in response to the product terms. The sum-of-products term is selectively transmitted during PAL operations, thereby allowing a user the option of implementing speed-sensitive logic using the high-speed PAL circuitry.

In another embodiment, a CLB includes four LMCs and switch circuits for routing input signals to and output signals from the LMCs. A multiplier circuit is also provided to perform multiplication functions. By providing four large general-purpose LMCs and a relatively small special-purpose multiplier circuit in a single CLB, large portions of a user's logic function can be implemented within a CLB, thereby avoiding propagation delays associated with signal transmission through general purpose interconnect resources of a PLD. In yet another embodiment, the CLB incorporates both LMCs and dedicated PAL circuits with the multiplexer circuit to provide high-speed logic implementations.

In yet another embodiment, an LMC includes a logic/memory array including four columns of programmable elements that are addressed by a hard-wired decoder during write operations. Bit values are read from each programmable element through series pass transistors that are controlled by read address signals generated by the hard-wired decoder, thereby increasing operating speeds during LUT and RAM operations. Further, by limiting the number of programmable elements connected to each read bit line to four, minimal capacitance is applied to the read bit lines, thereby further increasing operating speeds.

BRIEF DESCRIPTION OF THE DRAWINGS

FIG. 1(A) is a diagram showing a portion of a simplified prior art FPGA.

FIGS. 1(B), 1(C), and 1(D) are diagrams showing switch circuits utilized to route signals in the FPGA of FIG. 1(A).

DETAILED DESCRIPTION OF THE DRAWINGS

Figure 2A:
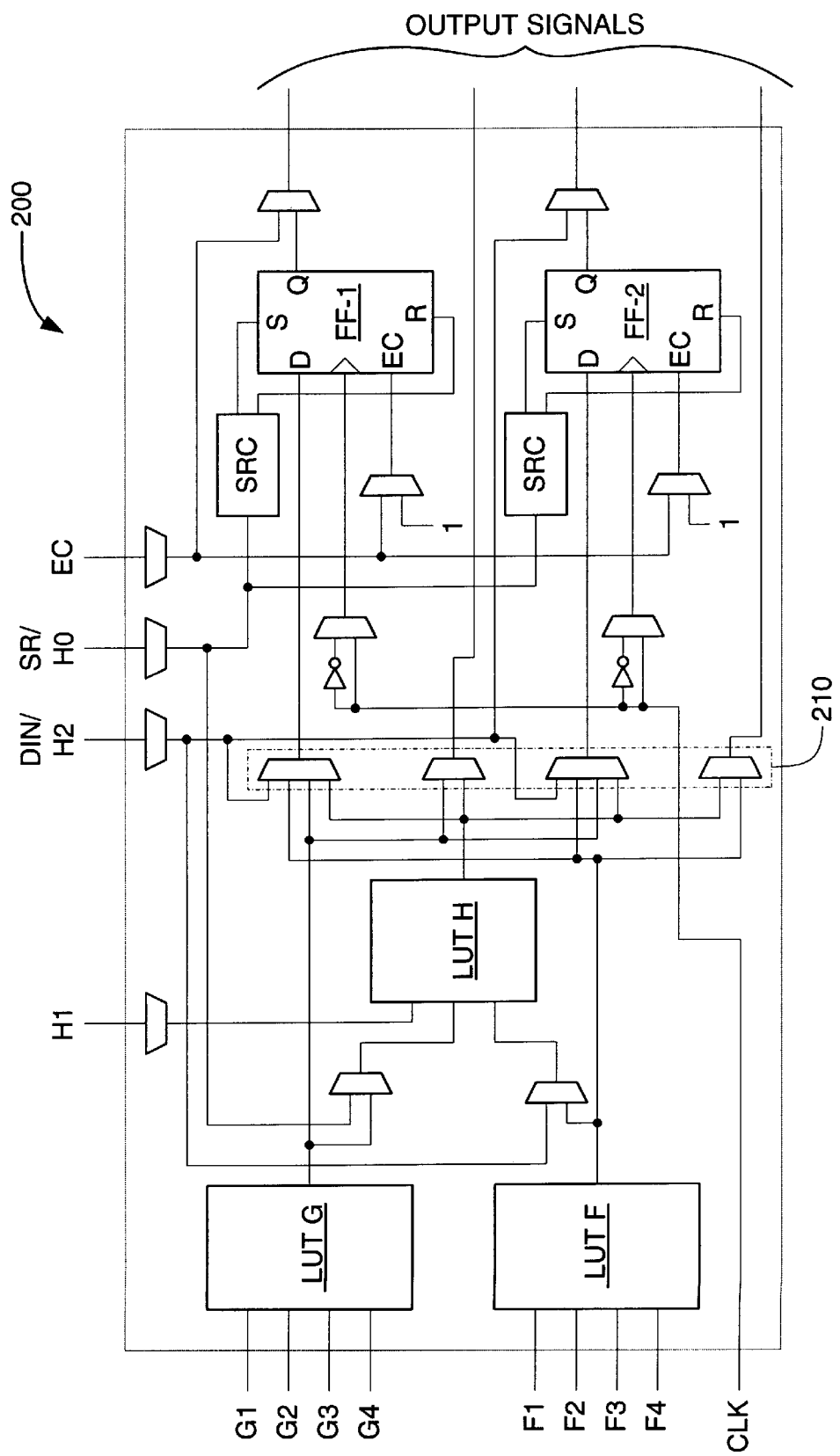
FIG. 2(A) is a simplified schematic diagram showing a CLB of a prior art FPGA.
Figure 2B:
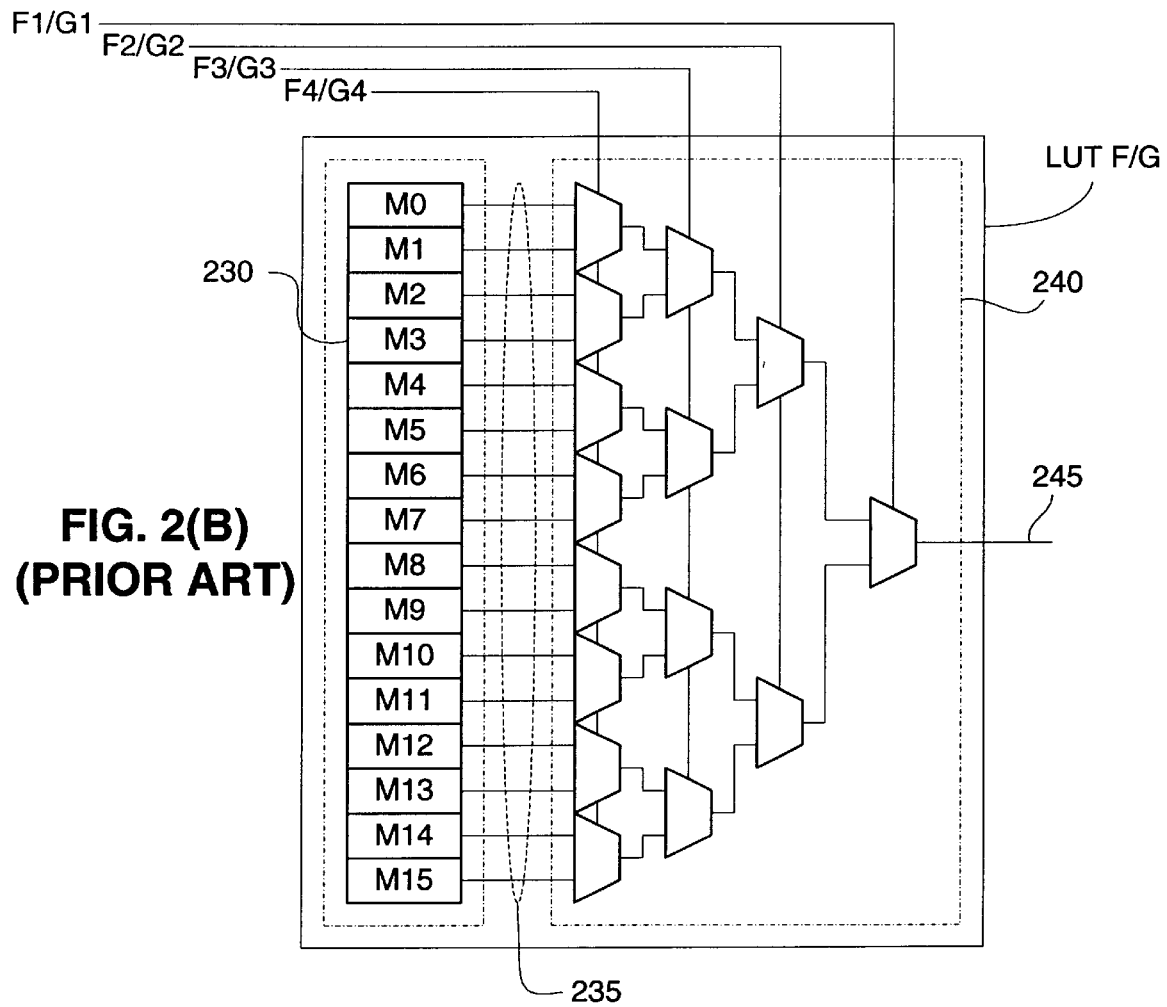
FIG. 2(B) is a simplified schematic diagram showing a four-input LUT of the CLB shown in FIG. 2(A).
Figure 2C:
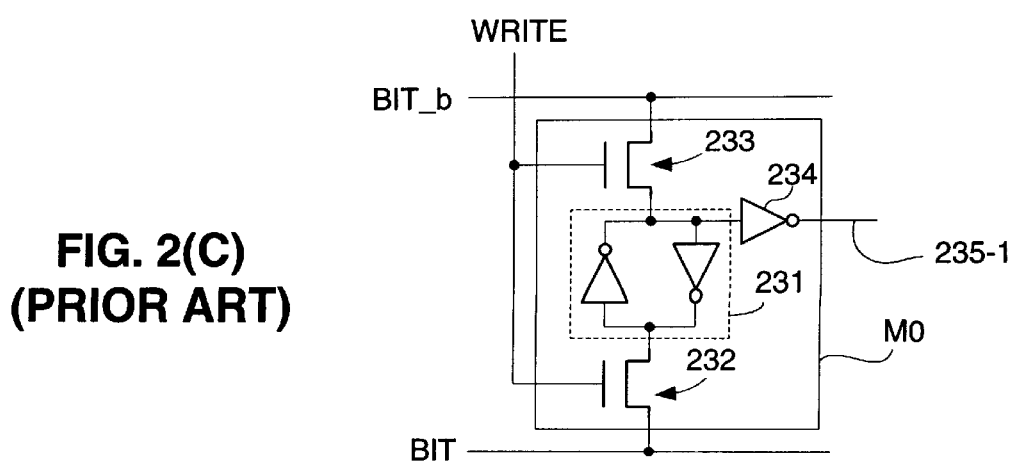
FIG. 2(C) is a simplified schematic diagram showing a memory cell of the four-input LUT shown in FIG. 2(B).
Figure 3:
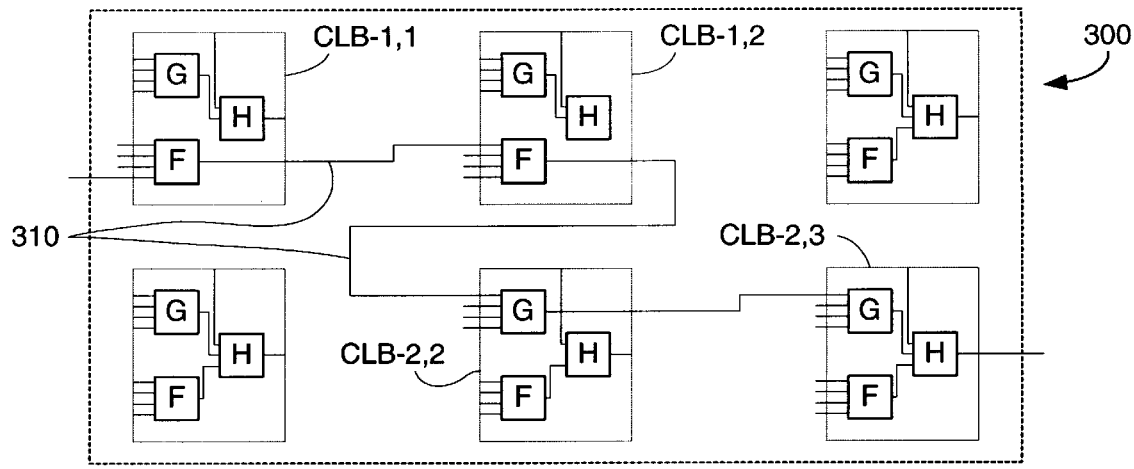
FIG. 3 is a simplified diagram showing a portion of a prior art FPGA and depicting a critical path used to route signals through several four-input LUTs.
Figure 4:
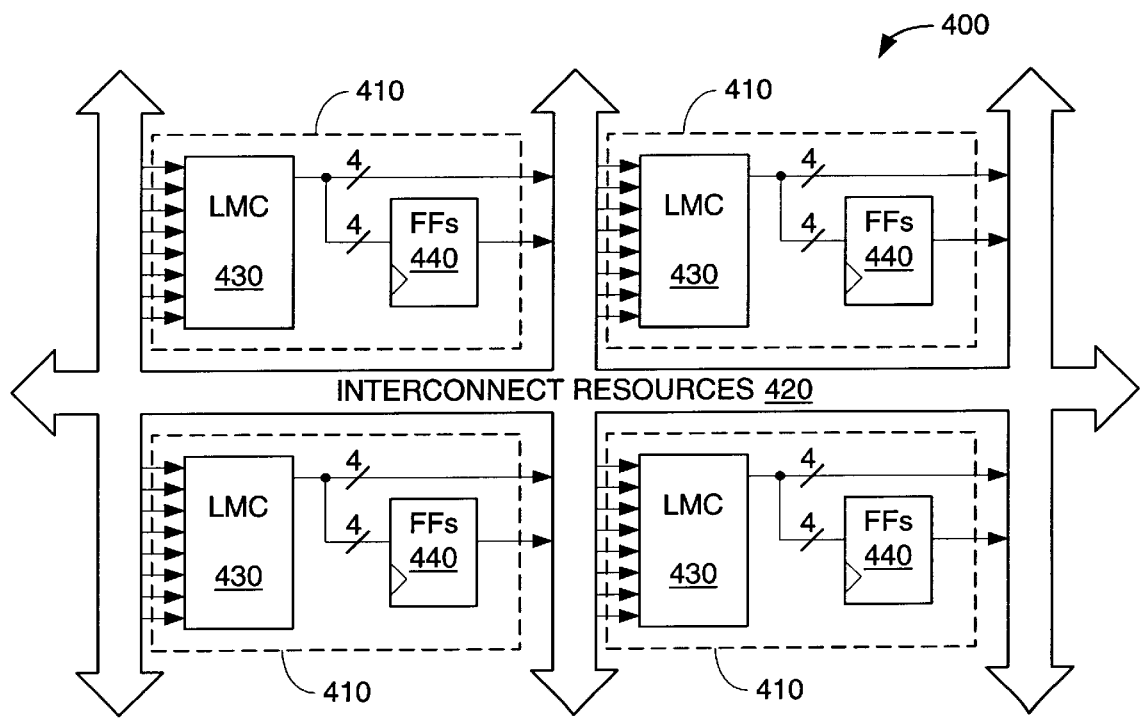
FIG. 4 is a block diagram showing a simplified PLD including a logic/memory circuit (LMC) formed in accordance with the present invention.

FIG. 4 shows a portion of an FPGA (PLD) 400 including a plurality of substantially identical configurable logic blocks (CLBs) 410 that are selectively connected via interconnect resources 420 in a manner consistent with standard FPGA technologies.

Each CLB 410 includes an eight-input logic/memory circuit (LMC) 430 and a register circuit (FFs) 440. Each LMC 430 receives eight data input signals from interconnect resources 420 and generates from one to four data output signals. Output signals from LMC 430 are either directly transmitted to interconnect resources 420, or transmitted through register circuit 440.

Interconnect resources 420 include, for example, interconnect line segments and switching circuitry such as that described above with respect to prior art FPGA 100 (see FIG. 1(A)). In one embodiment disclosed below, each channel of interconnect resources 420 includes eighty (80) parallel interconnect lines from which input signals are selectively routed to each CLB 410, and to which each CLB 410 transmits output signals. In other embodiments, each channel of interconnect resources 420 may include a different number of interconnect lines.

In accordance with the present invention, each LMC 430 includes an array of programmable elements and other configurable circuitry that is programmed by user-defined configuration data to implement either logic or memory functions. For example, in a first embodiment of the present invention, each LMC 430 is configurable to operate either (a) as an n-input lookup table (i.e., function generator) in which the array of programmable elements is selectively programmed to implement any arbitrarily defined Boolean function of up to n input signals, or (b) as a $2^n$-bit random access memory (RAM) in which the array of programmable elements stores bit values associated with memory words addressed by the input signals. In an alternative embodiment, LMC 430 is also configurable to selectively operate as an n-input programmable logic array (PLA) circuit for performing sum-of-products logic operations. In the alternative embodiment, the programmable element array is utilized as an AND array for generating one or more product terms (P-terms) in response to the input signals transmitted to LMC 430 via interconnect resources 420. Selected P-terms are routed to an OR gate to perform the sum-of-products logic operations. The various embodiments of LMC 430 are discussed in detail below.

In the following description, each LMC 430 has eight data input terminals and includes a logic/memory array that includes 256 programmable elements. Although LMC 430 can advantageously include a different (larger or smaller) number of inputs and an array having a different number of programmable elements, certain benefits are provided by forming LMC 430 with eight input terminals and 256 programmable elements. First, when LMC 430 is utilized as a LUT, certain logic functions requiring four or more four-input LUTs F/G can be implemented in less time by a single LMC 430, thereby significantly reducing the number of interconnect resources required to implement these logic functions. Techniques for programming an eight-input LUT are similar to those described in the "SMAP: Heterogeneous Technology Mapping for Area Reduction in FPGAs with Embedded Memory Arrays", by Steve Wilton published February, 1998, ACM/SIGDA International Symposium on Field-Programmable Gate Arrays, which describes mapping combinational logic in block RAM. Second, the 256-bit logic/memory circuits can be combined in a highly efficient manner when LMC 430 is utilized as a RAM circuit. These and other benefits of forming LMC 430 as an eight-input, 256 programmable element circuit are described in the following specific embodiments.

First Embodiment

FIGS. 5(A) through 5(D) show an LMC 430-1 in accordance with a first embodiment of the present invention. LMC 430-1 includes an array of programmable elements that can be selectively utilized either as an eight-input LUT or as a 256-bit RAM. Therefore, the array of programmable elements can be used to store portions of a user's logic function that include up to eight input signals. As such, LMC 430-1 is configurable to store a significantly larger portion of a user's logic function than prior art four-input (sixteen-bit) LUTs, thereby increasing operating speeds in certain applications by reducing signal propagation times.

In addition to implementing logic function portions, LMC 430-1 may also be used as a 256-bit RAM. Although the memory capacity (i.e., 256 bits) associated with each LMC 430-1 is smaller than a typical block RAM circuit, it is much larger than that of a conventional four-input, sixteen-bit LUT. Further, it is impractical to use conventional sixteen-bit LUTs to form large memory circuits because the overhead (i.e., interconnect resources) needed to operate such memory circuits is too high. These overhead constraints are reduced in LMC 430-1 because of the localization of 256 bits. Moreover, in comparison to block RAM structures, LMC 430-1 provides more flexibility for implementing memories of different sizes while minimizing unused memory capacity.

Figure 5A:
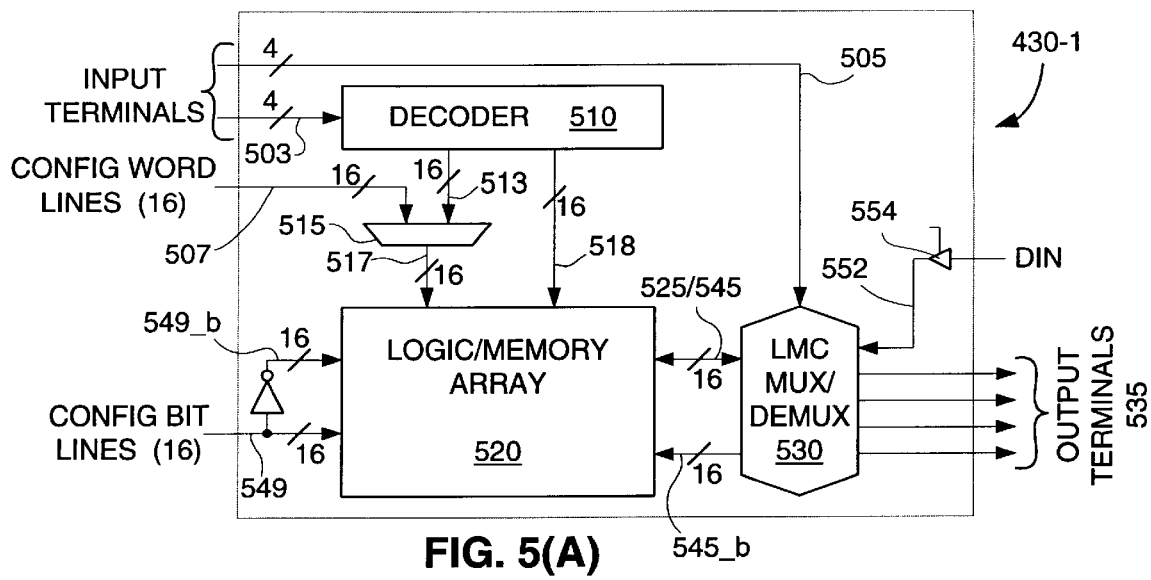
FIGS. 5(A), 5(B), 5(C), and 5(D) are diagrams showing portions of an LMC according to a first embodiment of the present invention.

FIG. 5(A) is a block diagram showing the basic circuit components of LMC 430-1. LMC 430-1 includes a decoder 510, a logic/memory (programmable element) array 520 and an LMC multiplexer/demultiplexer (MUX/DEMUX) 530. A first set of input signals is transmitted from interconnect resources 420 (see FIG. 4) to input terminals 503, and a second set of input signals is transmitted to input terminals 505. Configuration signals are transmitted from a configuration bus (not shown) on configuration word lines 507 and configuration bit lines 549 to logic/memory array 520. Output signals are transmitted from LMC MUX/DEMUX 530 on output terminals 535. Data (bit value) signals are written to logic/memory array 520 from interconnect resources 420 via a data input terminal DIN and LMC MUX/DEMUX 530.

Decoder 510 receives four input signals on input terminals 503, and generates therefrom sixteen write address signals on output lines 513 and sixteen read address signals on read word lines 518. The sixteen write address signals on output lines 513 are selectively transmitted to logic/memory array 520 during a memory write mode (e.g., when data is written to logic/memory array 520 via interconnect resources 420 during "normal" operation of FPGA 400). Alternatively, sixteen configuration address signals are transmitted to logic/memory array 520 on configuration word lines 507 during a configuration (start-up) mode. Multiplexer 515 selectively places either the write address signals from decoder 510 or the configuration address signals on a single set of write word lines 517 addressing logic/memory array 520.

Figure 5B:
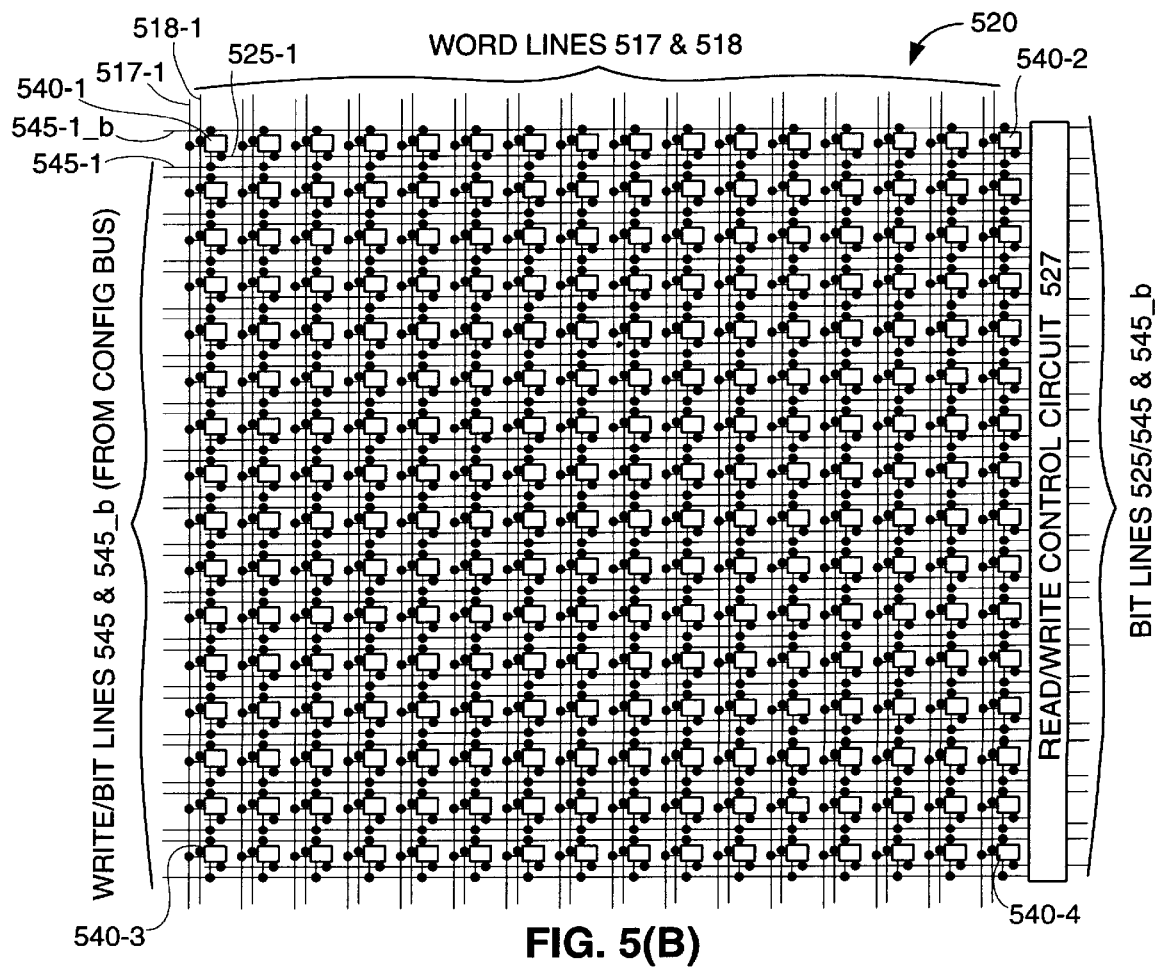
Figure 5C:
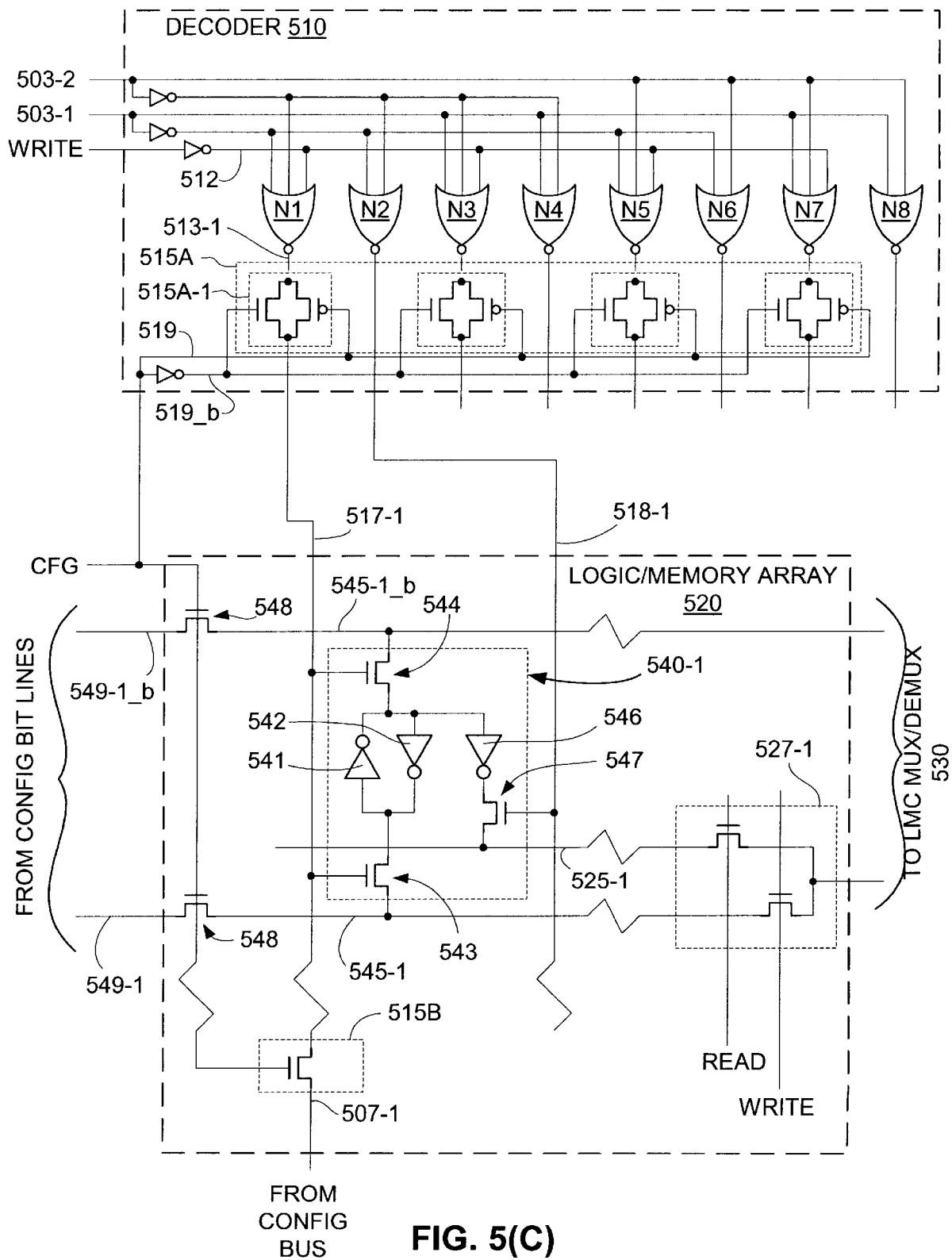

FIG. 5(C) shows a simplified decoder 510 that decodes two input signals received on input terminals 503-1 and 503-2. Each input signal is inverted, and selected pairs of the inverted and non-inverted input signals are applied to the input terminals of eight NOR gates N1 through N8. In addition, a write control signal WRITE is inverted and transmitted to NOR gates N1, N3, N5, and N7 on line 512. In response to the selected pairs of input signals and the WRITE control signal, NOR gates N1, N3, N5, and N7 generate write address signals on output lines 513 that are applied to four columns of programmable elements in logic/memory array 520. For example, NOR gate N1 generates a write address signal on line 513-1 in response to the WRITE control signal and the inverted input signals received at input terminals 503-1 and 503-2. This write address signal is applied to write word line 517-1 via a switch circuit 515A, which forms a part of multiplexer 515, shown in FIG. 5(A). Similarly, in response to the selected pairs of input signals, NOR gates N2, N4, N6, and N8 generate read address signals on read word lines 518 that are applied to the same four columns of programmable elements in logic/memory array 520. For example, NOR gate N2 generates a read address signal on read word line 518-1 in response to the inverted input signals received at input terminals 503-1 and 503-2. The switch circuits 515A are controlled by a configuration signal CFG that is transmitted in a non-inverted form on line 519, and in an inverted form on line 519_b. As discussed in detail below, switch circuits 515A pass the write address signals generated by NOR gates N1, N3, N5, and N7 in the memory write mode (i.e., when configuration signal CFG is logic low). Modification of decoder 510 to receive four input terminals and to generate sixteen read address signals and sixteen write address signals, as shown in FIG. 5(A), is easily accomplished in view of the disclosure shown in FIG. 5(C).

FIG. 5(B) shows a simplified representation of logic/memory array 520. Logic/memory array 520 includes 256 programmable elements 540 arranged in sixteen rows and sixteen columns. For example, a first row includes a first programmable element 540-1 and a second programmable element 540-2, and a sixteenth row includes a third programmable element 540-3 and a fourth programmable element 540-4. Similarly, a first column includes first programmable element 540-1 and third programmable element 540-3, and a sixteenth column includes second programmable element 540-2 and fourth programmable element 540-4. Each programmable element 540 receives a write address signal from an associated one of the sixteen (16) write word lines 517 and a read address signal from an associated one of the sixteen read word lines 518. In addition, each programmable element 540 is connected to an associated write bit line 545, an inverted write bit line 545_b, and a read bit line 525. For example, during the configuration mode, programmable element 540-1 is programmed by data signals received on write bit line 545-1 and inverted write bit line 545-1_b (from configuration bit line 549 via pass transistors 548, see FIG. 5(C)) in response to a high address signal received on write word line 517-1. In contrast, during a LUT operation or memory read mode, programmable element 540-1 transmits a stored data signal on read bit line 525-1 through a read/write control circuit 527 in response to a high address signal received on read word line 518-1. Finally, during a memory write operation, data values are transmitted from LMC MUX/DEMUX 530 (see FIG. 5(A)) to programmable element 540-1 via write bit line 545-1, inverted write bit line 545-1_b, and read/write control circuit 527.

Referring again to FIG. 5(C), details regarding programmable element 540-1 of logic/memory array 520 are now described. Programmable element 540-1 includes a latch for storing a bit value, and control circuitry for controlling writing the bit value to and reading the bit value from programmable element 540-1. Specifically, programmable element 540-1 includes a first inverter 541 and a second inverter 542 connected end-to-end to form a latch. This latch is connected to write bit line 545-1 and inverted write bit line 545-1_b via pass transistors 543 and 544, respectively. The gates of pass transistors 543 and 544 are connected to write word line 517-1. Therefore, when a high write address signal is applied to write word line 517-1, a bit value transmitted on write bit line 545-1 and inverted write bit line 545-1_b is stored in the latch. The latch is also connected through a third inverter 546 via a third pass transistor 547 to read bit line 525-1. The gate of pass transistor 547 is connected to read word line 518-1. Therefore, when a high read address signal is applied to read word line 518-1, the bit value stored in the latch is transmitted on read bit line 525-1.

As shown in FIG. 5(C), logic/memory array 520 also receives several control signals that control the operating mode of LMC 430-1.

As discussed above with reference to decoder 510, configuration signal CFG controls the source of address signals on write word lines 517 during the configuration and memory write modes. That is, during a memory write mode (i.e., when configuration signal CFG is low and the WRITE signal is high), write address signals generated on lines 513 are transmitted via first switch 515A of multiplexer 515 (see FIG. 5(A)) onto write word lines 517. For example, when CFG is low, the signal generated by NOR gate N1 is transmitted through switch 515A-1 onto write word line 517-1. This low CFG signal also turns off a second switch 515B of multiplexer 515 (shown at the bottom of logic/memory array 520) so that write word line 517-1 is isolated from configuration word line 507-1. Conversely, the CFG signal is high during the configuration mode, thereby turning off first switch 515A-1 and turning on second switch 515B to connect write word line 517-1 to configuration address line 507-1.

In addition to controlling the write word lines 517, the CFG signal is used with the WRITE signal and a READ signal to control write bit lines 545 and inverted write bit lines 545_b. That is, during a memory write mode (i.e., when the CFG signal is low, the WRITE signal is high and the READ signal is low), data (bit value) signals are transmitted from LMC MUX/DEMUX 530 (see FIG. 5(A)) onto write bit lines 545 and inverted write bit lines 545_b via read/write control circuit 527. For example, an inverted data value is transmitted from LMC MUX/DEMUX 530 onto inverted write bit line 545-1_b, and the high WRITE signal passes the data value onto write bit line 545-1. This data value is then passed to programmable element 540-1 when a high address signal is transmitted on write word line 517-1, which turns on pass transistors 543 and 544. During this memory write operation, the low CFG signal turns off pass transistors 548, thereby isolating write bit line 545-1 and inverted write bit line 545-1_b from configuration bit line 549-1 and inverted configuration bit line 549-1_b. During a LUT operation or memory read mode, the CFG signal remains low, the WRITE signal is low, and the READ signal is high, thereby passing data (bit value) signals from memory cell 540-1 in response to a high address signal transmitted on read word line 518-1. Finally, during the configuration mode (i.e., the CFG signal is high, and both the WRITE signal and the READ signal are low), pass transistors 548 are turned on to connect write bit line 545-1 and inverted write bit line 545-1_b to receive data signals from configuration bit line 549-1 and inverted configuration bit line 549-1_b, respectively.

Figure 5D:
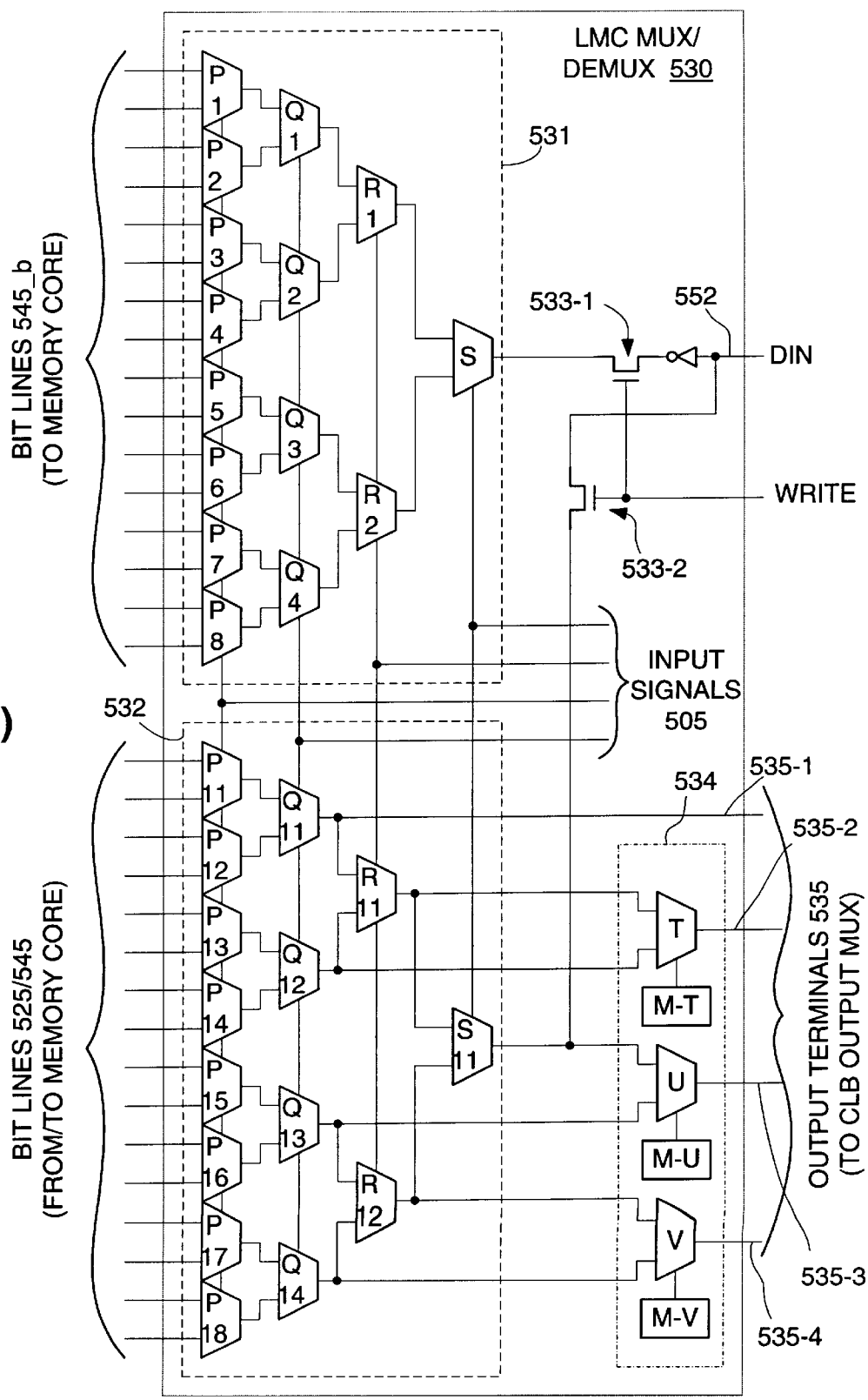

FIG. 5(D) is a simplified schematic diagram showing an embodiment of LMC MUX/DEMUX 530. LMC MUX/DEMUX 530 includes a sixteen-to-one demultiplexer circuit 531, a sixteen-to-one multiplexer/demultiplexer circuit 532, and a programmable output circuit 534.

During the memory write mode, demultiplexer circuit 531 receives an inverted form of a data signal received from input terminal DIN via pass transistor 533-1, and transmits the inverted data signal to a selected one of the inverted write bit lines 545_b. Demultiplexer circuit 531 includes a series of two-output demultiplexers P1–P8, Q1–Q4, R1, R2, and S with select terminals that receive the input signals transmitted on input terminals 505 (see FIG. 5(A)). Demultiplexer S receives the inverted data signal and passes it to either demultiplexer R1 or demultiplexer R2 in accordance with a first select signal. Similarly, demultiplexer R1 or demultiplexer R2 is controlled to pass the inverted data signal to one of demultiplexers Q1 through Q4, which in turn pass the inverted data signal to demultiplexers P1 through P8, which pass the inverted data signal to one of the inverted write bit lines 545_b.

Similarly, during the memory write mode, multiplexer/demultiplexer circuit 532 receives the data signal received from input terminal DIN via pass transistor 533-2, and transmits the data signal to a selected one of the write bit lines 545 (via read/write control circuit 527, see FIG. 5(C)). Multiplexer/demultiplexer circuit 532 includes a series of two-input multiplexer/demultiplexers P11–P18, Q11–Q14, R11, R12, and S11 with select terminals that receive the input signals transmitted on input terminals 505 (FIG. 5(A)). Demultiplexer S11 receives the data signal and passes it to either demultiplexer R11 or demultiplexer R12 in accordance with the first select signal. Similarly, demultiplexer R11 or demultiplexer R12 is controlled to pass the data signal to one of demultiplexers Q11 through Q14, which pass the data signal to demultiplexers P11 through P18, which pass the data signal to one of the write bit lines 545.

During LUT operation or memory read mode, multiplexer/demultiplexer circuit 532 transmits one or more of the data (bit value) signals transmitted on read bit lines 525 (via read/write control circuit 527, see FIG. 5(C)) to one or more of the output terminals 535. Specifically, in response to a first input signal received on input terminals 505 (FIG. 5(A)), multiplexers P11 through P18 pass a total of eight data signals from read bit lines 525 to multiplexers Q11 through Q14. Each multiplexer Q11 through Q14 receives two of the eight data values passed by multiplexers P11 through P18, and passes a selected one of the two data values in response to a second input signal. Each multiplexer R11 and R12 receives two of the four data values passed by multiplexers Q11 through Q14, and passes a selected one of the two data values in response to a third address signal. Finally, two-input multiplexer S11 receives the two data values passed by multiplexers R11 and R12, and passes a selected one of the two data values in response to a fourth address signal.

Output signals from LMC 430-1 are transmitted on output terminals 535-1 through 535-4 via programmable output circuit 534. Programmable output circuit 534 is controlled by configuration data to transmit one, two, or four of the stored data signals on output terminals 535-1 through 535-4. Specifically, when four of the stored data signals are transmitted from LMC 430-1, multiplexers T, U, and V are controlled by memory cells M-T, M-U, and M-V to pass signals transmitted through multiplexers Q12, Q13, and Q14 to output terminals 535-2, 535-3, and 535-4, respectively. (The signal passed through multiplexer Q11 is applied directly to output terminal 535-1). Alternatively, when two of the stored data signals are transmitted from LMC 430-1, multiplexers T and V are controlled by memory cells M-T and M-V to pass signals transmitted through multiplexers R11 and R12 to output terminals 535-2 and 535-4, respectively (the signals passed to output terminals 535-1 and 535-3 are ignored by a CLB output control circuit. Finally, when only one of the stored data signals is transmitted from LMC 430-1, multiplexer U is controlled by memory cell M-U to pass the signal transmitted through multiplexer S11 to output terminal 535-3 (the signals passed to output terminals 535-1, 535-2, and 535-4 are ignored by the CLB output control circuit.

Although depicted as a series of two-to-one multiplexers in FIG. 5(D), artisans familiar with multiplexer circuitry will understand that the function of sixteen-to-one multiplexer circuit 531 and multiplexer/demultiplexer circuit 532 can be implemented with, for example, one or more four-to-one multiplexers or multiplexer/demultiplexers.

As set forth in the description above, LMC 430-1 selectively utilizes the programmable elements of logic/memory array 520 to form either an eight-input LUT or a 256-bit RAM. For example, when LMC 430-1 is utilized as an eight-input LUT, the programmable elements are used to implement any arbitrary Boolean function of up to eight input signals. Of these eight input signals, four input signals received on input terminals 503 are transmitted to decoder 510, which addresses a selected column of programmable elements in logic/memory array 520 such that the data (bit values) stored in the selected column is transmitted on read bit lines 525. The other four input signals received on input terminals 505 are transmitted to LMC MUX/DEMUX 530 to selectively pass one, two, or four of the signals on read bit lines 525 to output terminals 535. Similarly, when logic/memory circuit 430-1 is utilized as a RAM circuit, the programmable elements of logic/memory array 520 are used to store sixteen words of information, each word including sixteen bits. The first four input signals 503 address a selected word (column), and the second four input signals 505 control the serial transmission of the data bits associated with the selected word onto output terminals 535.

By selectively configuring LMC MUX/DEMUX 530 to pass one, two, or four stored data signals stored in logic/memory array 520, a user can utilize LMC 430 to implement any single logic function portion having up to eight input terms, some pairs of logic function portions having up to seven input terms, and some sets of four logic function portions having six input terms. In addition, LMC MUX/DEMUX 530 can be configured to transmit memory data as a single series of sixteen bits, as two groups of eight bits, or as four groups of four bits.

Second Embodiment

FIGS. 6(A) through 6(D) show an LMC 430-2 in accordance with a second embodiment of the present invention. Similar to LMC 430-1 (FIG. 5(A)), the programmable elements of LMC 430-2 can be selectively utilized either as an eight-input LUT or as a 256-bit RAM. However, in addition to these operational modes, LMC 430-2 can be used to selectively operate as an eight-input programmable array logic (PAL) circuit or as a content addressable memory (CAM). During PAL operations, the same programmable elements used for LUT and RAM operations are used to generate a plurality of product terms in response to input signals received on the same input terminals used for LUT and RAM operations. These product terms are selectively ORed together in a macrocell to form a sum-of-products term. As discussed above, logic emulation using PLA/PAL circuitry is generally faster than LUT logic operations. Therefore, LMC 430-2 allows a user to implement his or her logic functions in either a high-density LUT format or a high-speed PAL format. In addition, the same programmable elements and input terminals are utilized for both PAL and LUT operations, thereby providing a highly flexible and space efficient configurable logic block for a PLD. This flexibility is further enhanced by selectively configuring product term generation circuitry to provide CAM operations.

Figure 6A:
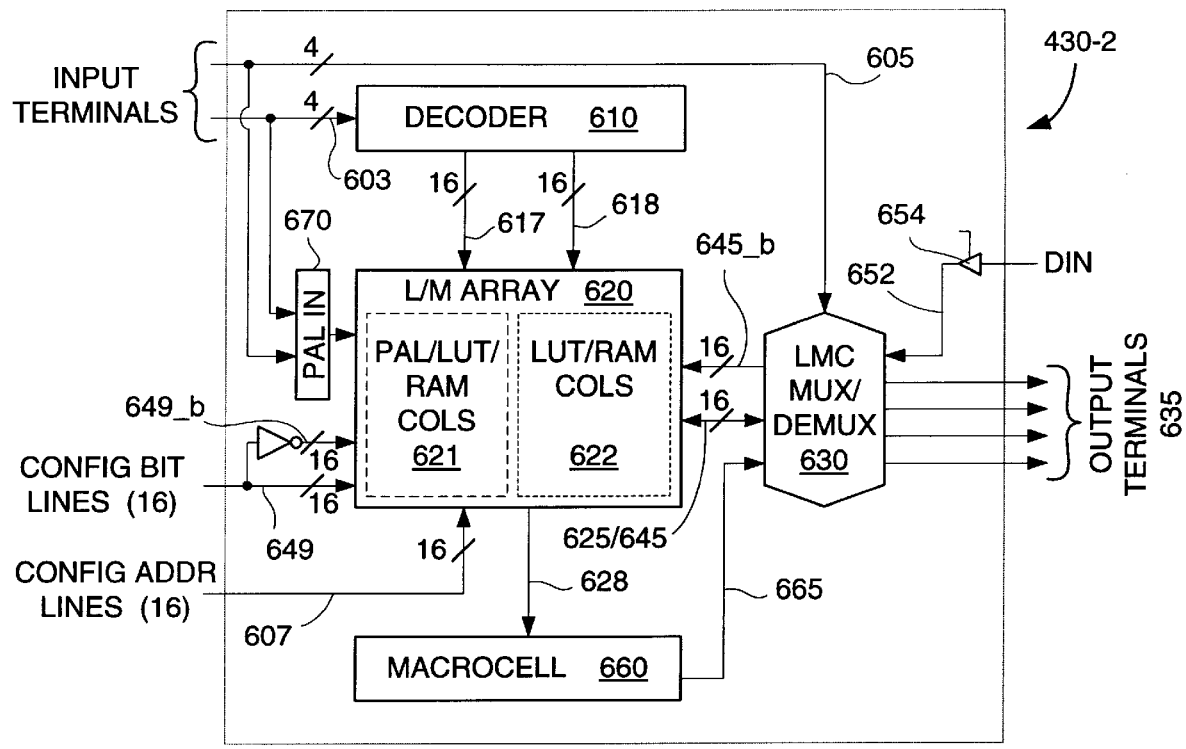
FIGS. 6(A), 6(B), 6(C), and 6(D) are diagrams showing portions of an LMC according to a second embodiment of the present invention.

Referring to FIG. 6(A), LMC 430-2 includes a decoder 610, a logic/memory array (L/M ARRAY) 620, a LMC multiplexer/demultiplexer (MUX/DEMUX) (switch circuit) 630, a macrocell 660, and a PAL input (PAL IN) control circuit 670. Similar to decoder 510 of LMC 430-1 (FIG. 5(A)), decoder 610 is connected to receive four input signals on a first set of input terminals 603, and generates sixteen write address signals that are transmitted to logic/memory array 620. Logic/memory array 620 also receives sixteen configuration address signals on configuration address lines 607 from a configuration bus (not shown). Control circuitry (discussed below) is provided to apply either the write address signals generated by decoder 610 onto write word lines 617 during memory write operations, or to apply the configuration address signals on configuration address lines 607 onto write word lines 617 during the configuration mode. Decoder 610 also generates sixteen read address signals on read word lines 618 that are utilized during the LUT operation and memory read modes such that the bit values stored in programmable elements 640 (FIG. 6(C)) are written onto read bit lines 625. LMC MUX/DEMUX 630 is responsive to input signals received by input terminals 605 such that it transmits bit values from selected read bit lines 625 to output terminals 635 during the LUT operation and memory read modes. In addition, LMC MUX/DEMUX 630 is responsive to the input signals to transmit input data values from data input terminal DIN to selected write bit lines 645 and inverted write bit lines 645_b during the memory write mode.

LMC 430-2 differs from LMC 430-1 (FIG. 5(A)) in that it includes product term generation circuitry (discussed below), a macrocell 660, and PAL input control circuit 670. During PAL and CAM operations, PAL input control circuit 670 passes the input signals received at input terminals 603 and 605 onto write bit lines 645 of logic/memory array 620. In addition, logic/memory array 620 includes the product term generation circuitry that generates product terms in response to the input signals on write bit lines 645 and the bit values stored in the programmable elements of logic/memory array 620. During CAM operations, these product terms also indicate that the input signals match values stored in the memory cells aligned in one column of logic/memory array 620. These product terms are transmitted on lines 628 to macrocell 660, which generates a sum-of-products term that is transmitted on macrocell output line 665 to LMC MUX/DEMUX 630. As described below, LMC MUX/DEMUX 630 includes output control circuitry that passes either bit values transmitted on selected read bit lines 625 or the sum-of-products term generated by macrocell 630. Therefore, LMC 430-2 allows a user to selectively implement logic using either a LUT format or a PAL format. Because PAL operations are typically faster than LUT operations, this added flexibility makes LMC 430-2 useful for applications in which the speed of small logic portions is important. The flexibility of LMC 430-2 is further enhanced by selectively performing CAM operations.

Figure 6B:
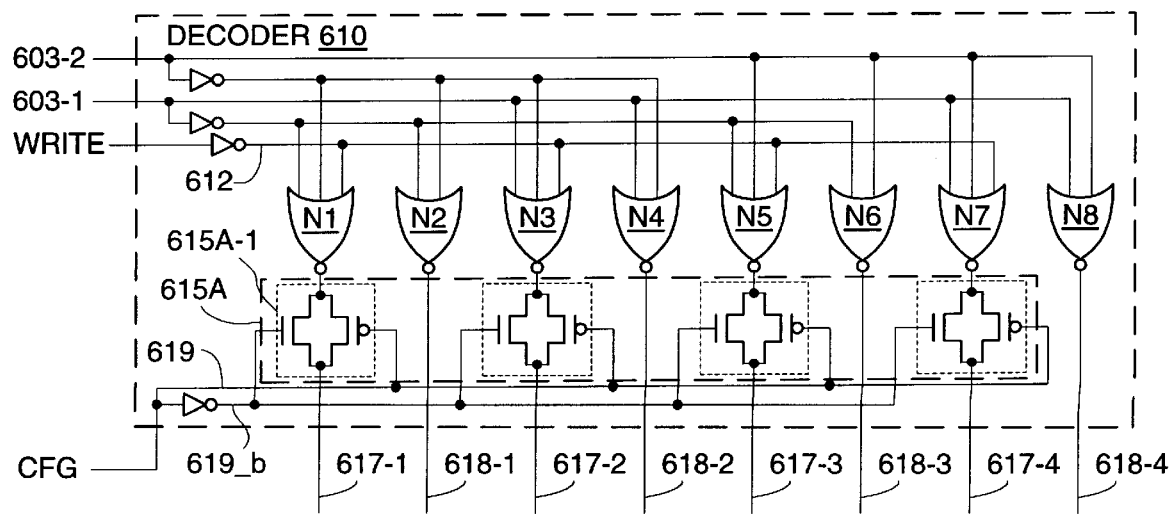

FIG. 6(B) shows a simplified decoder 610 that decodes two input signals received on input terminals 603-1 and 603-2, and generates write address signals on write word lines 617-1 through 617-4 and read address signals on read word lines 618-1 through 618-4. Each input signal is inverted, and selected pairs of the inverted and non-inverted input signals are applied to the input terminals of eight NOR gates N1 through N8. In addition, a write control signal WRITE is inverted and transmitted to NOR gates N1, N3, N5 and N7 on line 612. In response to the selected pairs of input signals and the WRITE control signal, NOR gates N1, N3, N5, and N7 generate write address signals that are applied to four columns of programmable elements in logic/memory array 620. For example, NOR gate N1 generates a write address signal in response to the WRITE control signal and the inverted input signals received at input terminals 603-1 and 603-2. This write address signal is applied to write word line 617-1 via a switch circuit 615A. Similarly, in response to the selected pairs of input signals, NOR gates N2, N4, N6, and N8 generate read address signals on output lines 618-1 through 618-4 that are applied to the same four columns of programmable elements in logic/memory array 620. Switch circuit 615A is controlled by a configuration signal CFG on lines 619 and line 619_b to pass the write address signals generated by NOR gates N1, N3, N5, and N7 in the memory write mode. Modification of decoder 610 to receive four input terminals and to generate sixteen read address signals and sixteen write address signals, as shown in FIG. 6(A), is easily accomplished in view of the disclosure shown in FIG. 6(B).

Figure 6C:
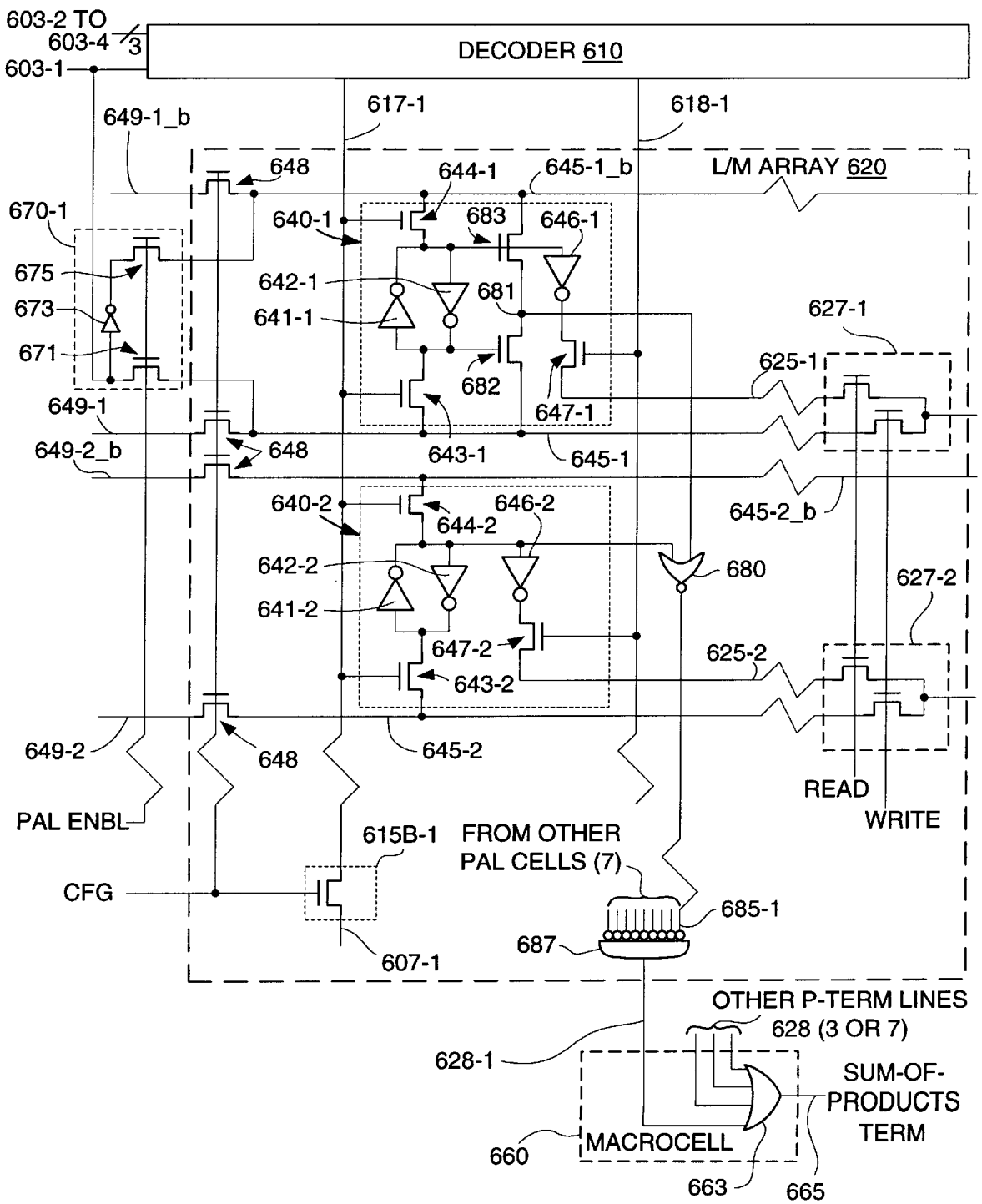

Referring again to FIG. 6(A), logic/memory array 620 includes 256 programmable elements arranged in sixteen rows and sixteen columns that are divided into two groups: a first group of eight columns (PAL/LUT/RAM COLS) 621 that perform PAL/CAM, LUT, and RAM operations, and a second group of eight columns (LUT/RAM COLS) 622 that are used only for LUT and RAM operations. Each column of first group 621 includes sixteen programmable elements arranged to form eight pairs (referred to below as "PAL/CAM cells"). A representative pair of programmable elements from one column of first group 621 is shown in FIG. 6(C) and is described below. The programmable elements of second group 622 are essentially identical to programmable element 540-1 shown in FIG. 5(C). Therefore, a description of the programmable elements provided in second group 622 is omitted for brevity.

Logic/memory array 620 utilizes CFG, WRITE, and READ control signals in a manner similar to those used in logic/memory array 520 (see FIG. 5(C)).

Configuration signal CFG controls the source of address signals on write word lines 617 during the configuration and memory write modes in a manner similar to that described above with reference to FIG. 5(C). For example, during a memory write mode (CFG is low), a signal generated by decoder 610 is passed through switch 615A-1 (see FIG. 6(B)) onto write word line 617-1. Conversely, the CFG signal is high during the configuration mode, thereby turning off first switch 615A-1 and turning on second switch 615B-1 (see FIG. 6(C)) to connect write word line 617-1 to configuration address line 607-1.

The WRITE signal and the READ signal are also used with the CFG signal to control write bit lines 645 and inverted write bit lines 645_b. For example, a data value transmitted from LMC MUX/DEMUX 630 (see FIG. 6(A)) is passed onto write bit line 645-1 or write line 645-2 when the WRITE signal is high, and a data value is passed from read bit lines 625-1 or 625-2 to LMC MUX/DEMUX 630 when the READ signal is high. Finally, during the configuration mode (i.e., the CFG signal is high, and both the WRITE signal and the READ signal are low), pass transistors 648 are turned on to connect write bit lines 645-1 and 645-2 and inverted write bit lines 645-1_b and 645-2_b to receive data signals from configuration bit lines 649-1 and 649-2 and inverted configuration bit lines 649-1_b and 649-2_b.

In addition to the CFG, WRITE, and READ control signals, LMC 430-2 utilizes a PAL enable (PAL ENBL) control signal to cause PAL input control circuit 670 (see FIG. 6(A)) to apply input signals from input terminals 603 onto write bit lines 645 during PAL and CAM operations. Referring to FIG. 6(C), PAL input control circuit 670-1 includes a first pass transistor 671, an inverter 673, and a second pass transistor 675. When PAL ENBL is high, PAL input control circuit 670-1 selectively passes an input signal from input terminal 603-1 directly to write bit line 645-1, and through inverter 673 to inverted write bit line 645-1_b. When PAL ENBL is low, pass transistors 671 and 675 are turned off, thereby preventing the input signal on input terminal 603-1 from being passed to write bit line 645-1 and inverted write bit line 645-1_b.

FIG. 6(C) shows one PAL/CAM cell and associated circuitry of logic/memory array 620. The PAL/CAM cell is formed from an associated pair of programmable elements 640-1 and 640-2 that are arranged sequentially in one column of logic/memory array 620. Each programmable element 640-1 and 640-2 includes a latch for storing a bit value, and control circuitry for controlling writing to and reading from the latch. Specifically, programmable element 640-1 includes a first inverter 641-1 and a second inverter 642-1 connected end-to-end to form a first latch, and programmable element 640-2 includes a first inverter 641-2 and a second inverter 642-2 connected end-to-end to form a second latch. The first latch of programmable element 640-1 is connected to write bit line 645-1 and inverted write bit line 645-1_b via pass transistors 643-1 and 644-1, respectively. The gates of pass transistors 643-1 and 644-1 are connected to write word line 617-1. The second latch of programmable element 640-2 is connected to write bit line 645-2 and inverted write bit line 645-2_b via pass transistors 643-2 and 644-2, respectively. The gates of pass transistors 643-2 and 644-2 are also connected to write word line 617-1. Therefore, when a high write address signal is applied to write word line 617-1, bit values transmitted on write bit lines 645-1 and 645-2 and on inverted write bit lines 645-1_b and 645-2_b are stored in the first and second latches of programmable elements 640-1 and 640-2, respectively. The latches are also connected through third inverters 646-1 and 646-2 via third pass transistors 647-1 and 647-2 to read bit lines 625-1 and 625-2, respectively. The gates of pass transistors 647-1 and 647-2 are connected to read word line 618-1. Therefore, when a high read address signal is applied to read word line 618-1, the bit values stored by the latches of programmable elements 640-1 and 640-2 are transmitted on read bit lines 625-1 and 625-2, respectively.

Product terms are generated by product term circuitry in response to input signals transmitted on write bit line 645-1 and inverted write bit line 645-1_b from PAL input circuit 670-1, and in response to values stored in the PAL/CAM cells (e.g., programmable elements 640-1 and 640-2). The product term circuitry includes a plurality of PAL/CAM cell logic circuits 680 and one or more AND gates 687.

As indicated in FIG. 6(C), each PAL/CAM cell logic circuit 680 is a two-input NOR gate having a first input terminal connected to a node 681 (shown inside of programmable element 640-1) and a second input terminal connected to programmable element 640-2. Node 681 is connected to write bit line 645-1 through a first pass transistor 682, and to inverted bit line 645-1_b through a second pass transistor 683. The gates of first pass transistor 682 and second pass transistor 683 are respectively controlled by the non-inverted and inverted value stored by the latch of programmable element 640-1. For example, when the latch formed by inverters 641-1 and 642-1 stores a logic low value (i.e., a logic low signal is generated at the output of inverter 642-1), then node 681 is connected to inverted write bit line 645-1_b. Conversely, when the latch formed by inverters 641-1 and 642-1 stores a logic high value (i.e., a logic high signal is generated at the output of inverter 642-1), then node 681 is connected to write bit line 645-1. Thus, PAL/CAM cell logic circuit 680 generates a PAL/CAM cell output signal based on the programmed state of programmable elements 640-1 and 640-2, and on the PAL input signal on input terminal 603-1 (which is transmitted on write bit line 645-1 and inverted write bit line 645-1_b). The PAL/CAM cell output signal is transmitted to AND circuit 687.

AND circuit 687 receives PAL/CAM cell output signals from PAL/CAM cell logic circuit 680, and also from other PAL/CAM cells and associated logic circuits (not shown) arranged in the column including programmable elements 640-1 and 640-2. These PAL/CAM cell output signals are utilized (in inverted form) by AND circuit 687 to generate a P-term signal that is transmitted on P-term line 628-1 to macrocell 660.

Macrocell 660 includes an OR gate 663 that receives the P-term signals from P-term line 628-1, along with three or seven additional P-term signals from other columns of logic/memory array 620. Macrocell 660 generates a sum-of-products term in response to these P-term signals that is transmitted to LMC MUX/DEMUX 630 via macrocell output line 665.

Logic/memory array 620 is controlled by the configuration signals to operate in a configuration mode, a memory read (i.e., LUT operation or RAM read) mode, a memory write mode, a PAL operation mode, and a CAM operation mode. The operation of second group 622 (i.e., LUT/RAM COLS) is essentially the same as described above with respect to logic/memory array 520, and therefore is not repeated here. The operation of first group 621 (i.e., PAL/LUT/RAM COLS) is described as follows with reference to FIG. 6(C).

During a configuration mode, the CFG control signal is high, and the WRITE and PLA ENBL control signals are low (the READ signal is either high or low, i.e., "don't care"). The high CFG signal turns off switch circuit 615A-1 (see FIG. 6(B)), and turns on switch circuit 615B-1 so that an address signal is transmitted from configuration address line 607-1 onto write word line 617-1. In addition, the high CFG signal turns on pass transistors 648 to connect write bit lines 645 and 645_b to configuration bit lines 649 and 649_b, respectively. Note that the low WRITE signal prevents signals from being passed to write bit lines 645-1, 645-1_b, 645-2, and 645-2_b from LMC MUX/DEMUX 630. Note also that the low PLA ENBL signal prevents the transmission of input signals from input terminal 603-1 to write bit lines 645-1 and 645-2. In this state, data values are simultaneously transmitted to programmable element 640-1 via write bit lines 645-1 and 645-1_b, and to programmable element 640-2 via write bit lines 645-2 and 645-2_b. Programmable elements 640-1 and 640-2 retain these data values until a subsequent data write process is performed (or power is turned off).

During the memory write mode, the WRITE signal is high, and the CFG, READ, and PAL ENBL signals are low. The high WRITE signal enables NOR gates N1, N3, N5, and N7 (see FIG. 6(B)) to generate address signals on write bit lines 617-1 through 617-4 in response to input signals received by input terminals 603-1 and 603-2. The high WRITE signal is also applied to read/write control circuits 627-1 and 627-2 to connect write bit lines 645-1 and 645-2 to LMC MUX/DEMUX 630. Note that the low CFG signal turns on switch circuit 615A-1 (see FIG. 6(B)), and turns off switch circuit 615B-1. In addition, the low CFG signal turns off pass transistors 648. In this state, data signal DIN is transmitted from LMC MUX/DEMUX 630 to a selected write bit line 645-1 or 645-2 (as well as to a selected inverted write bit line 645-1_b or 645-2_b) in response to operation of LMC MUX/DEMUX 630 (discussed below).

During a memory read (LUT operation or RAM read) mode, the READ signal is high, and the CFG, WRITE, and PAL ENBL signals are low. The high READ signal is applied to read/write control circuits 627-1 and 627-2 to connect read bit lines 625-1 and 625-2 to LMC MUX/DEMUX 630. The low WRITE signal disables NOR gates N1, N3, N5, and N7 (see FIG. 6(B)), and the low CFG signal turns off switch circuit 615B-1. In addition, the low CFG signal turns off pass transistors 648. In this state, bit values stored in programmable elements 640-1 and 640-2 are transmitted on read bit lines 625-1 and 625-2 in response to a high read address signal transmitted from decoder 610 on read word line 618-1. As discussed below, the stored bit values are transmitted via read bit lines 625-1 and 625-2 to LMC MUX/DEMUX 630.

During the PAL and CAM operation modes, the PAL ENBL signal is high, and the WRITE and CFG signals are low (READ is "don't care"). The high PAL ENBL signal turns on pass transistors 671 and 675 of PAL input control circuit 670-1, thereby passing the input signal from input terminal 603-1 to write bit line 645-1, and an inverted form of the input signal to inverted write bit line 645-1_b. The value stored by programmable element 640-2 enables or disables the PAL/CAM cell formed by programmable elements 640-1 and 640-2. When programmable element 640-2 stores a logic low value (i.e., a logic high value is generated at the output of inverter 641-2), this logic low value causes PAL/CAM cell logic circuit 680 to generate a low output signal, regardless of the value stored in programmable element 640-1 and the input signals on write bit lines 645-1 and 645-1_b. When programmable element 640-2 stores a logic high value, PAL/CAM cell logic circuit 680 generates an output signal that is determined by the value stored in programmable element 640-1 and the input signal transmitted in its non-inverted form on write bit line 645-1, and in its inverted form on inverted write bit line 645-1_b. When both values stored in programmable elements 640-1 and 640-2 are logic high values, then the signal transmitted from PAL/CAM cell logic circuit 680 is the non-inverted input signal from write bit line 645-1. When programmable element 640-1 stores a logic low value and programmable element 640-2 stores a logic high value, then the signal transmitted from PAL/CAM cell logic circuit 680 is the inverted input signal from inverted write bit line 645-1_b. For example, PAL/CAM cell logic circuit 680 transmits a low (logic zero) signal to AND gate 687 when both programmable elements 640-1 and 640-2 store high (logic one) values and the non-inverted input signal on write line 645-1 is logic high. PAL/CAM cell logic circuit 680 transmits a high (logic one) signal to AND gate 687 when programmable element 640-1 stores a low (logic zero) value, programmable element 640-2 stores a high (logic one) value, and the non-inverted input signal on write bit line 645-1 is low.

Note that the CAM operation mode is a type of PAL operation in which eight-bit "words" are stored in each of the columns of PAL/CAM cells. For example, referring to FIG. 6(C), assume that both programmable elements 640-1 and 640-2 of the illustrated PAL/CAM cell store logic high values, and that each PAL/CAM cell in the column including programmable elements 640-1 and 640-2 also store logic high values. If both the four input signals transmitted from input terminals 603-1 through 603-4 and the four input signals transmitted from input terminals 605 are also logic high values, then eight "match" (logic low) signals are transmitted from the PAL/CAM cell logic circuits (similar to PAL/CAM cell logic circuit 680 in FIG. 6(C)) to AND gate 687, which transmits a "match" signal to macrocell 660. Because at least one of the four (or eight) P-term signals transmitted on P-term lines 628 is high, macrocell 660 transmits a sum-of-products "match" (logic high) signal to LMC MUX/DEMUX 630. Conversely, when none of the stored eight-bit words match the input signals, then none of the P-term signals transmitted on P-term lines 628 is high, and macrocell 660 transmits a sum-of-products "no-match" (logic low) signal to LMC MUX/DEMUX 630.

Figure 6D:
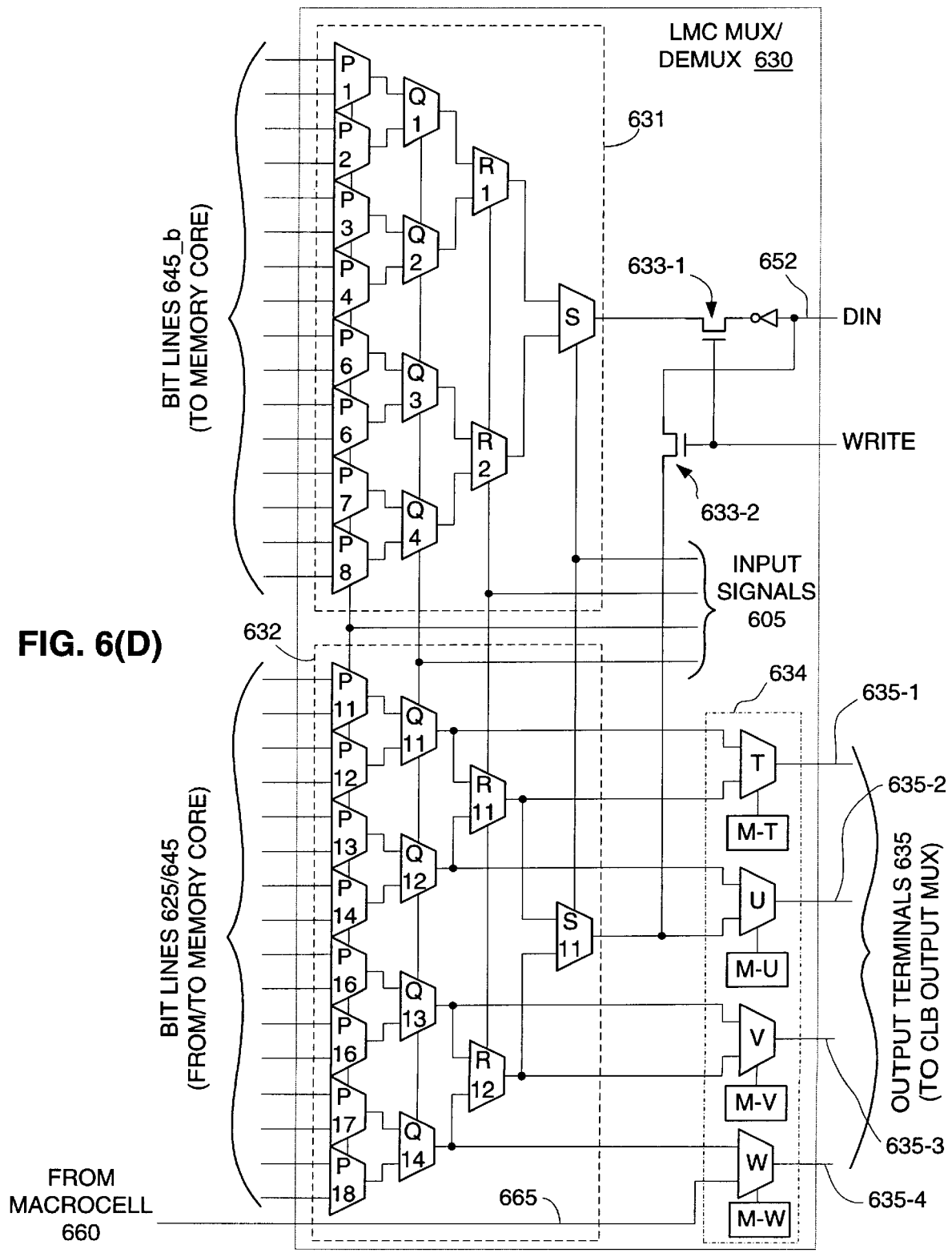

FIG. 6(D) is a simplified schematic diagram showing an embodiment of LMC MUX/DEMUX 630. Similar to LMC MUX/DEMUX 530 (discussed above), LMC MUX/DEMUX 630 includes a sixteen-to-one demultiplexer circuit 631, a sixteen-to-one multiplexer/demultiplexer circuit 632, and a programmable output circuit 634. Demultiplexer circuit 631 includes two-input multiplexers P1–P8, Q1–Q4, R1, R2, and S, with select terminals that receive the input signals transmitted on input terminals 605. Second multiplexer circuit 632 includes a series of two-input multiplexers P11–P18, Q11–Q14, R11, R12, and S11 with select terminals also receiving the input signals transmitted on input terminals 605.

During the memory write mode, demultiplexer circuit 631 receives an inverted form of a data signal DIN via pass transistor 633-1, and transmits the inverted data signal to one of the inverted write bit lines 645_b via two-input multiplexers P1–P8, Q1–Q4, R1, R2, and S of demultiplexer circuit 631 in accordance with the input signals transmitted on input terminals 605. Similarly, multiplexer/demultiplexer circuit 632 receives the data signal DIN via pass transistor 633-2, and transmits the data signal to a selected one of the write bit lines 645 (via read/write control circuit 627, see FIG. 6(C)).

During the memory read (LUT operation or RAM read) mode, multiplexer/demultiplexer circuit 632 transmits one or more of the data (bit value) signals from read bit lines 625 to one or more of output terminals 635-1 through 635-4 via programmable output circuit 634. Programmable output circuit 634 is controlled by configuration data to transmit one, two, or four of the stored data signals to output terminals 635-1 through 635-4. Specifically, when four of the stored data signals are transmitted from LMC 430-2, multiplexers T, U, V, and W are controlled by memory cells M-T, M-U, M-V, and M-W to pass signals transmitted through multiplexers Q11, Q12, Q13, and Q14 to output terminals 635-1, 635-2, 635-3, and 635-4, respectively. Alternatively, when two of the stored data signals are transmitted from LMC 430-2, multiplexers T and V are controlled by memory cells M-T and M-V to pass signals transmitted through multiplexers R11 and R12 to output terminals 635-1 and 635-3, respectively (the signals passed to output terminals 635-2 and 635-4 are ignored). Finally, when only one of the stored data signals is transmitted from LMC 430-2, multiplexer U is controlled by memory cell M-U to pass the signal transmitted through multiplexer S11 to output terminal 635-2 (the signals passed to output terminals 635-1, 635-3, and 635-4 are ignored).

During PLA/CAM operation modes, the only bit value typically output from LMC 430-2 is the sum-of-products (match/no-match) value generated by macrocell 660. The sum-of-products value is passed through multiplexer W, which is controlled by memory cell M-U, to output terminal 635-4 (the signals passed to output terminals 635-1, 635-2, and 635-3 are ignored).

As set forth in the description above, LMC 430-2 can selectively utilize the programmable elements of logic/memory array 620 to implement logic using either an eight-input LUT or an eight-input PAL. Therefore, a user can select between the high density and flexibility of LUT operations, and the speed of PAL operations. This capability allows the user to, for example, implement smaller or speed-critical logic groups using PAL operations in some LMCS, while implementing selected large or complex functions using LUT operations. Because both operations are performed using the same programmable elements, a PLD incorporating an array of LMCs 430-2 can be used for a wide range of logic applications.

Third Embodiment

FIGS. 7(A) through 7(D) show an LMC 430-3 in accordance with a third embodiment of the present invention. Similar to LMC 430-1 (FIG. 5(A)) and LMC 430-2 (FIG. 6(A)), the programmable elements of LMC 430-3 can be selectively utilized either as an eight-input LUT or as a 256-bit RAM. In addition, similar to LMC 430-2 (FIG. 6(A)), LMC 430-3 can selectively operate as an eight-input programmable array logic (PAL) circuit, thereby allowing a user to implement his or her logic functions in either a high-density LUT format or a high-speed PAL/CAM format. In addition, the same programmable elements and input terminals are utilized for both PAL/CAM and LUT operations, thereby providing a highly flexible and space-efficient configurable logic block for a PLD.

Figure 7A:
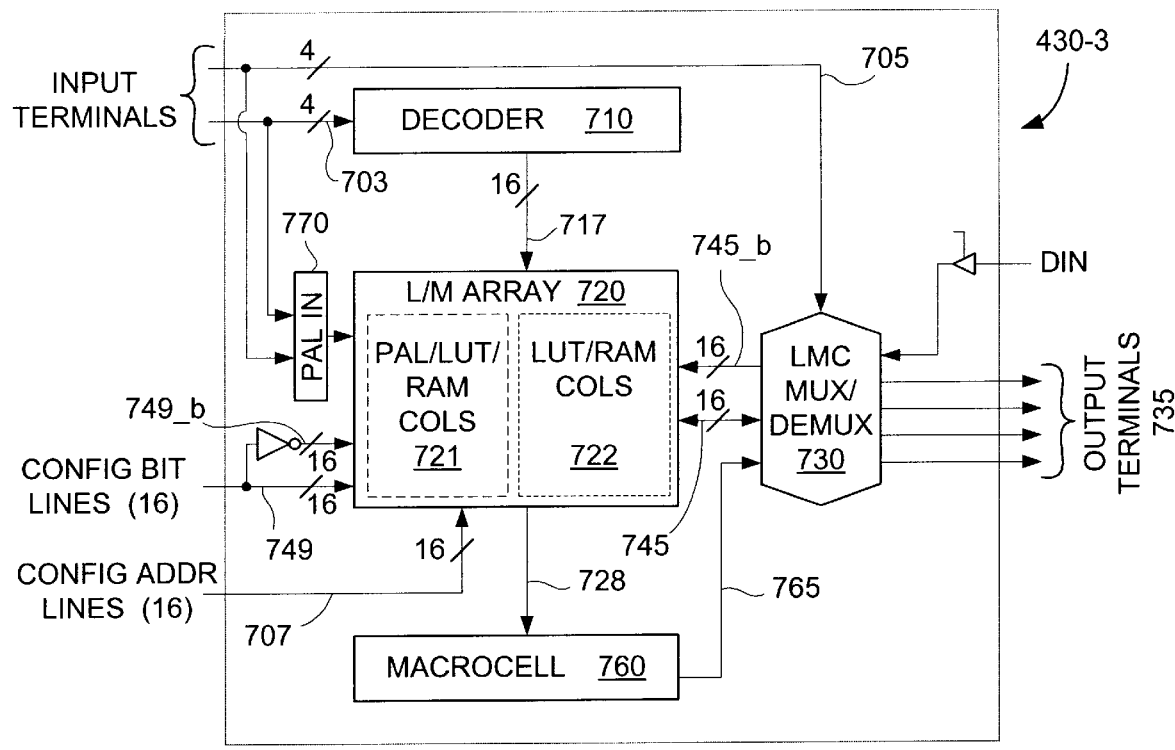
FIGS. 7(A), 7(B), 7(C), and 7(D) are diagrams showing portions of an LMC according to a third embodiment of the present invention.

Referring to FIG. 7(A), LMC 430-3 includes a decoder 710, a logic/memory array (L/M ARRAY) 720, a LMC multiplexer/demultiplexer (MUX/DEMUX) (switch circuit) 730, a macrocell 760, and a PAL input (PAL IN) control circuit 770. Decoder 710 is connected to receive four input signals on a first set of input terminals 703, and generates sixteen address signals that are transmitted to logic/memory array 720 on address lines 717. Logic/memory array 720 also receives sixteen configuration address signals on lines 707 from a configuration bus (not shown). LMC MUX/DEMUX 730 is responsive to input signals received by input terminals 705 such that it transmits bit values from selected bit lines 745 to output terminals 735 during the LUT operation and memory read modes. In addition, LMC MUX/DEMUX 730 is responsive to the input signals to transmit input data values from data input terminal DIN to selected bit lines 745 and inverted bit lines 745_b during the memory write mode.

In addition, LMC 430-3 includes product term generation circuitry (discussed below), a macrocell 760, and PAL input control circuit 770. During PAL and CAM operations, PAL input control circuit 770 passes the input signals received at input terminals 703 and 705 onto bit lines 745 of logic/memory array 720. In addition, logic/memory array 720 includes the product term generation circuitry that generates product terms in response to the input signals on bit lines 745 and the bit values stored in the programmable elements of logic/memory array 720. These product terms are transmitted on P-term lines 728 to macrocell 760, which generates a sum-of-products term that is transmitted on macrocell output line 765 to LMC MUX/DEMUX 730. As described below, LMC MUX/DEMUX 730 includes output control circuitry that passes either bit values transmitted on selected bit lines 745 or the sum-of-products term generated by macrocell 760. Therefore, LMC 430-3 allows a user to selectively implement logic using either a LUT format or a PAL/CAM format. Because PAL operations are typically faster than LUT operations, this added flexibility makes LMC 430-3 useful for applications in which the speed of small logic portions is important.

Figure 7B:
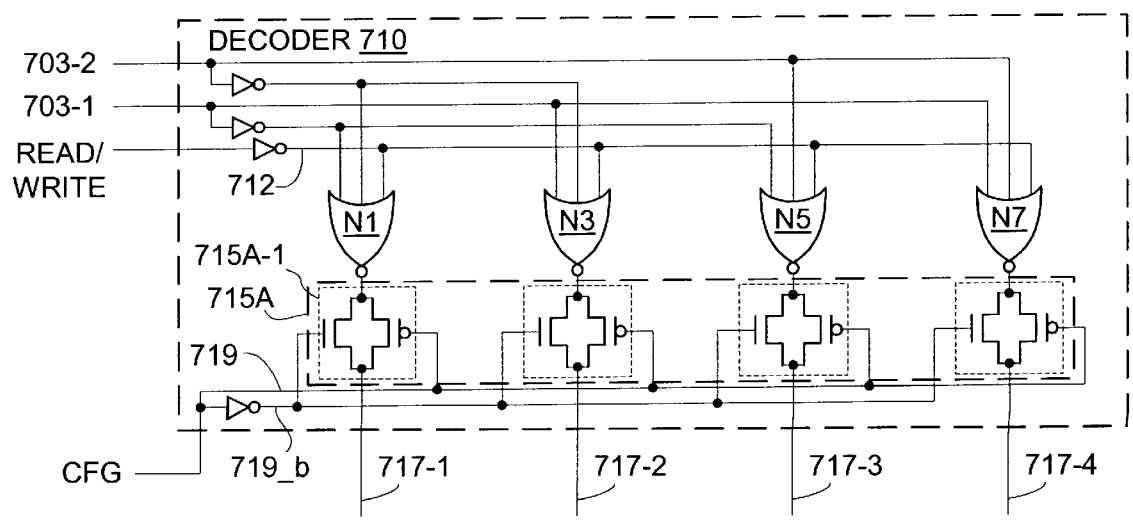

FIG. 7(B) shows a simplified decoder 710 that decodes two input signals received on input terminals 703-1 and 703-2, and generates read/write address signals on word lines 717-1 through 717-4. Each input signal is inverted, and selected pairs of the inverted and non-inverted input signals are applied to the input terminals of four NOR gates N1, N3, N5, and N7. In addition, a read/write control signal READ/WRITE is inverted and transmitted to NOR gates N1, N3, N5, and N7 on line 712. In response to the selected pairs of input signals and the READ/WRITE control signal, NOR gates N1, N3, N5, and N7 generate read/write address signals that are applied to four columns of programmable elements in logic/memory array 720. For example, NOR gate N1 generates an address signal in response to the READ/WRITE control signal and the inverted input signals received at input terminals 703-1 and 703-2. This address signal is applied to word line 717-1 via a switch circuit 715A. Switch circuit 715A is controlled by a configuration signal CFG on lines 719 and line 719_b to pass the address signals generated by NOR gates N1, N3, N5, and N7 in the memory write mode. Modification of decoder 710 to receive four input terminals and to generate sixteen read/write address signals, as shown in FIG. 7(A), is easily accomplished in view of the disclosure shown in FIG. 7(B).

Figure 7C:
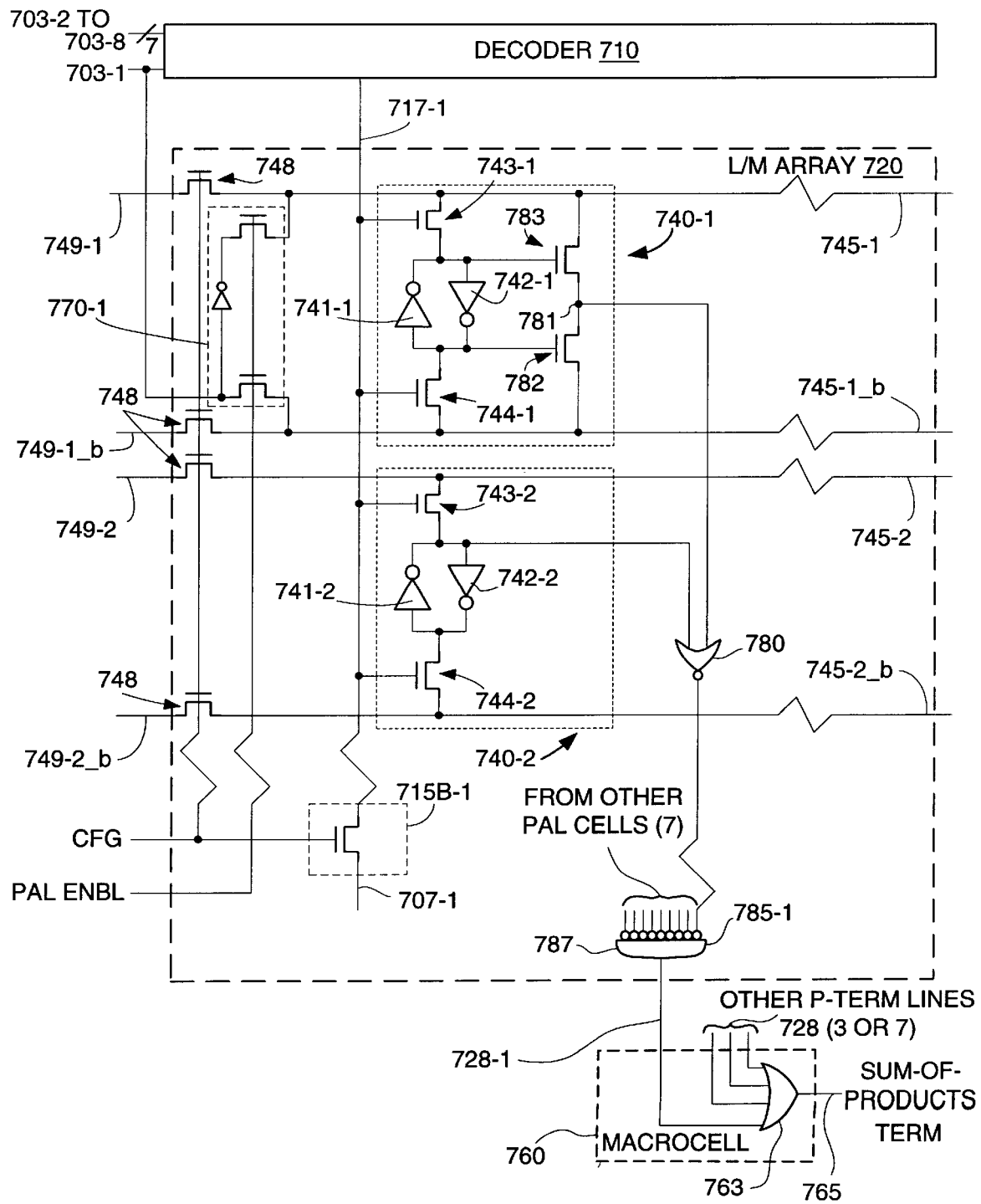

Referring again to FIG. 7(A), logic/memory array 720 includes 256 programmable elements arranged in sixteen rows and sixteen columns that are divided into two groups: a first group of eight columns (PAL/LUT/RAM COLS) 721 that perform PAL/CAM, LUT, and RAM operations, and a second group of eight columns (LUT/RAM COLS) 722 that are used only for LUT and RAM operations. Each column of first group 721 includes sixteen programmable elements arranged to form eight pairs (referred to below as "PAL/CAM cells"). A representative pair of programmable elements from one column of first group 721 is shown in FIG. 7(C), and described below. The programmable elements of second group 722 are similar to programmable element 540-1 without the high-speed memory read circuitry (i.e., inverter 546, transistor 547, and read bit line 525-1; see FIG. 5(C)). Therefore, a description of the programmable elements provided in second group 722 is omitted for brevity.

Similar to logic/memory array 620 (see FIG. 6(C)), logic/memory array 720 utilizes the configuration CFG control signal and the PAL enable (PAL ENBL) control signal to control the signals applied to bit lines 745 and 745_b, and also uses a READ/WRITE control signal in decoder 710 to control address signals transmitted onto word lines 717 during both memory read and memory write operations. Note that the separate READ and WRITE control signals utilized by logic/memory array 620 are not used in logic/memory array 720.

Configuration signal CFG controls the source of address signals on word lines 717 during the configuration mode in a manner similar to that described above with respect to LMC 430-2 (see FIG. 6(C)). For example, during a memory write mode (CFG is low and READ/WRITE is high), a signal generated by decoder 710 is passed through switch 715A-1 (see FIG. 7(B)) onto word line 717-1. Conversely, the CFG signal is high during the configuration mode, thereby turning off first switch 715A-1 and turning on second switch 715B-1 (see FIG. 7(C)) to connect word line 717-1 to configuration address line 707-1. The CFG signal is also used to control bit lines 745 and inverted bit lines 745_b. For example, during the memory write mode, CFG is low, and a data value transmitted from LMC MUX/DEMUX 730 (see FIG. 7(A)) is passed onto bit line 745-1. During LUT operation or RAM read modes, a data value is passed from bit line 745-1 to LMC MUX/DEMUX 730. In contrast, during the configuration mode (i.e., the CFG signal is high), pass transistors 748 are turned on to connect bit lines 745-1 and 745-2 and inverted bit lines 745-1_b and 745-2_b to receive data signals from configuration bit lines 749-1 and 749-2 and inverted configuration bit lines 749-1_b and 749-2_b.

The PAL enable (PAL ENBL) control signal causes PAL input control circuit 770 (see FIG. 7(A)) to apply input signals from input terminals 703 onto bit lines 745 during PAL operations. Referring to FIG. 7(C), PAL input control circuit 770-1 includes pass gates and an inverter that operate in the manner described above with respect to PAL input control circuit 670-1 (see FIG. 6(C)).

FIG. 7(C) shows one PAL/CAM cell and associated circuitry of logic/memory array 720. The PAL/CAM cell is formed from a pair of programmable elements 740-1 and 740-2 that are arranged sequentially in one column of logic/memory array 720. Each of programmable elements 740-1 and 740-2 includes a latch for storing a bit value, and control circuitry for controlling writing to and reading from the latch. Specifically, programmable element 740-1 includes a first inverter 741-1 and a second inverter 742-1 connected end-to-end to form a first latch, and programmable element 740-2 includes a first inverter 741-2 and a second inverter 742-2 connected end-to-end to form a second latch. The first latch of programmable element 740-1 is connected to bit line 745-1 and inverted bit line 745-1_b via pass transistors 743-1 and 744-1, respectively. The gates of pass transistors 743-1 and 744-1 are connected to word line 717-1. The second latch of programmable element 740-2 is connected to bit line 745-2 and inverted bit line 745-2_b via pass transistors 743-2 and 744-2, respectively. The gates of pass transistors 743-2 and 744-2 are also connected to word line 717-1. Therefore, when a high address signal is applied to word line 717-1, bit values are either transmitted from bit lines 745-1 and 745-2 and inverted bit lines 745-1_b and 745-2_b to be stored in the first and second latches of programmable elements 740-1 and 740-2, respectively, or are read from the first and second latches onto these bit lines.

Product terms are generated by product term circuitry connected to bit lines 745-1 and 745-1_b, and to the PAL/CAM cells (i.e., associated pairs of programmable elements). The product term circuitry includes a plurality of PAL/CAM cell logic circuits 780 and one or more AND gates 787. As indicated in FIG. 7(C), each PAL/CAM cell logic circuit 780 is a two-input NOR gate having a first input terminal connected to a node 781 (shown inside of programmable element 740-1) and a second input terminal connected to programmable element 740-2. Node 781 is connected to write bit line 745-1 through a first pass transistor 783, and to inverted bit line 745-1_b through a second pass transistor 782. The gates of first pass transistor 783 and second pass transistor 782 are respectively controlled by the inverted and non-inverted value stored by the latch of programmable element 740-1. Similar to corresponding circuitry described above with reference to FIG. 6(C), PAL/CAM cell logic circuit 780 generates a PAL/CAM cell output signal based on the programmed state of programmable elements 740-1 and 740-2, and on the PAL input signal on input terminal 703-1 (which is transmitted on write bit line 745-1 and inverted write bit line 745-1_b). The PAL/CAM cell output signal is transmitted to AND circuit 787, which also receives PAL/CAM cell output signals from other PAL/CAM cell logic circuits (not shown) from other programmable elements in the same column as programmable elements 740-1 and 740-2. These PAL/CAM cell output signals are utilized (in inverted form) by AND circuit 787 to generate a P-term signal that is transmitted on P-term line 728-1 to macrocell 760.

Macrocell 760 includes an OR gate 763 that receives the P-term signals from P-term line 728-1, along with three or seven additional P-term signals from other columns of logic/memory array 720. Macrocell 760 generates a sum-of-products term in response to these P-term signals that is transmitted to LMC MUX/DEMUX 730 via macrocell output line 765.

Logic/memory array 720 is controlled by the configuration signals to operate in a configuration mode, a memory read (i.e., LUT operation or RAM read) mode, a memory write mode, and PAL/CAM operation modes. The operation of second group 722 (i.e., LUT/RAM COLS) is essentially the same as described above with respect to logic/memory array 520, and therefore is not repeated here. The operation of first group 721 (i.e., PAL/LUT/RAM COLS) is described as follows with reference to FIG. 7(C).

During a configuration mode, the CFG control signal is high, and the PLA ENBL control signal is low (READ/WRITE is "don't care"). The high CFG signal turns off switch circuit 715A-1 (see FIG. 7(B)), and turns on switch circuit 715B-1 so that an address signal is transmitted from configuration address line 707-1 onto word line 717-1. In addition, the high CFG signal turns on pass transistors 748 to connect bit lines 745 and 745_b to configuration bit lines 749 and 749_b. Note that the low PLA ENBL signal prevents the transmission of input signals from input terminal 703-1 to bit lines 745-1 and 745-1_b. In this state, data values are simultaneously transmitted to programmable element 740-1 via bit lines 745-1 and 745-1_b, and to programmable element 740-2 via bit lines 745-2 and 745-2_b. Programmable elements 740-1 and 740-2 retain these data values until a subsequent data write process is performed (or power is turned off).

During the memory write mode, the CFG and PAL ENBL signals are low, and the READ/WRITE control signal is high. The low CFG signal turns on switch circuit 715A-1 (see FIG. 7(B)), and turns off switch circuit 715B-1. Enabled by the high READ/WRITE signal, NOR gates N1, N3, N5, and N7 (see FIG. 7(B)) generate address signals on word lines 717-1 through 717-4 in response to input signals received by input terminals 703-1 and 703-2. Note that the low CFG signal turns off pass transistors 748. In this state, data signal DIN is transmitted from LMC MUX/DEMUX 730 to a selected bit line 745-1 or 745-2 (as well as to a selected inverted bit line 745-1_b or 745-2_b) in response to operation of LMC MUX/DEMUX 730 (discussed below).

During a memory read (LUT operation or RAM read) mode, the CFG and PAL ENBL control signals are low, and the READ/WRITE control signal is high. The high READ/WRITE signal causes NOR gates N1, N3, N5, and N7 (see FIG. 7(B)) to generate address signals on word lines 717-1 through 717-4 in response to input signals received by input terminals 703-1 and 703-2. The low CFG turns on switch circuit 715A-1, and turns off switch circuit 715B-1. In addition, the low CFG signal turns off pass transistors 748. In this state, bit values stored in programmable elements 740-1 and 740-2 are transmitted on bit lines 745-1 and 745-2 in response to a high address signal transmitted from decoder 710 on word line 717-1. As discussed below, the stored bit values are transmitted via bit lines 745-1 and 745-2 to LMC MUX/DEMUX 730.

During the PAL/CAM operation modes, the PAL ENBL signal is high, and the CFG signal is low (READ/WRITE is "don't care"). The high PAL ENBL signal turns on PLA enable control circuit 770-1, thereby passing the input signal from input terminal 703-1 to bit line 745-1, and an inverted form of the input signal to inverted bit line 745-1_b. The PAL input signals on bit lines 745-1 and 745-1_b are transmitted to the first input terminal of PAL/CAM cell logic circuit 780 in accordance with the value stored in programmable element 740-1. The value stored in programmable element 740-2 is transmitted to the second input terminal of PAL/CAM cell logic circuit 780. PAL/CAM cell logic circuit 780 generates either a high (logic one) signal or a low (logic zero) signal depending upon the bit values stored in programmable elements 740-1 and 740-2, and in response to the true and compliment PAL input signals transmitted on bit lines 745-1 and 745-1_b. The logic performed by PAL/CAM cell logic circuit 780 is identical to that described above with reference to PAL/CAM cell logic circuit 680.

Figure 7D:
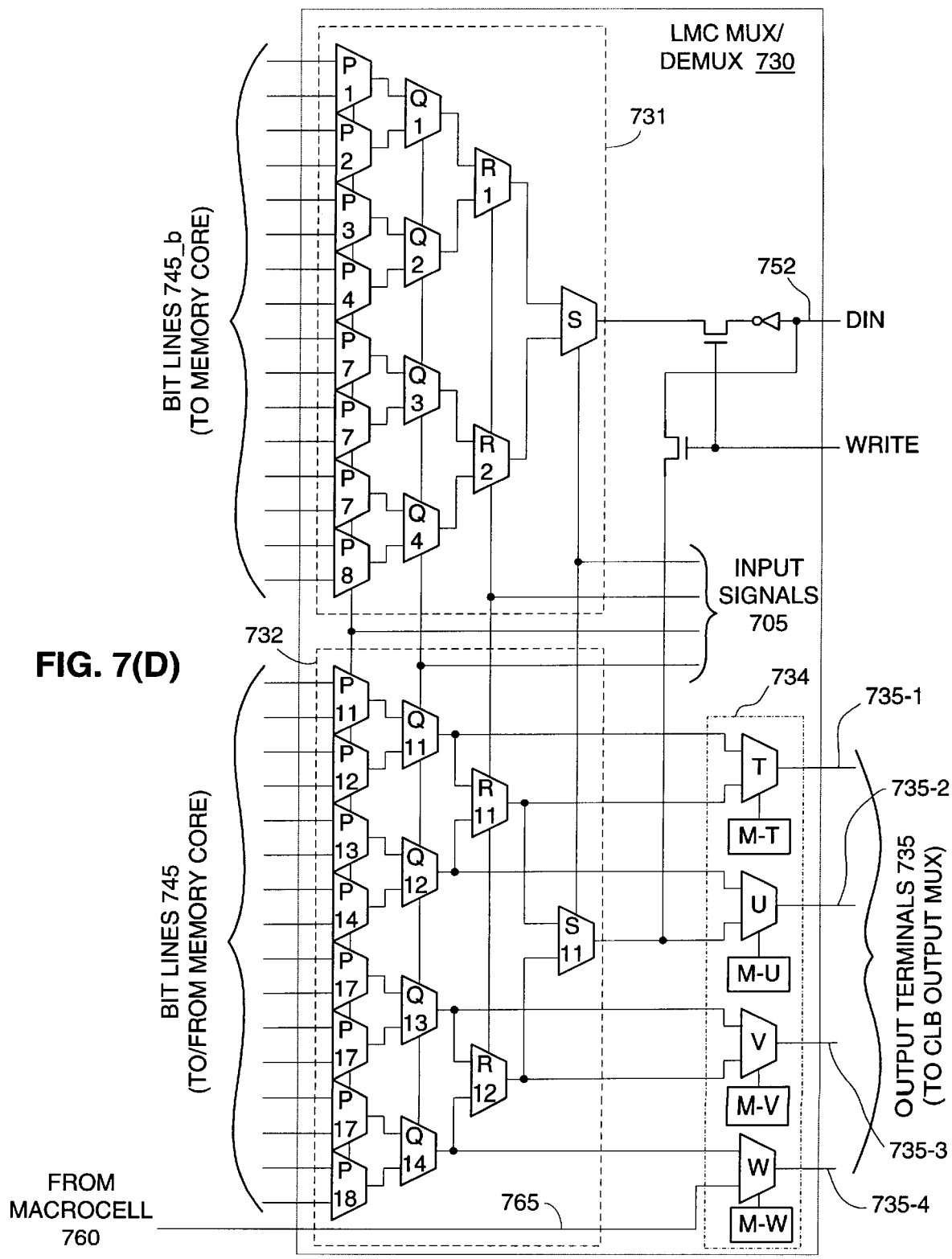

FIG. 7(D) is a simplified schematic diagram showing one embodiment of LMC MUX/DEMUX 730. LMC MUX/DEMUX 730 is essentially identical to LMC MUX/DEMUX 630 (discussed above), the only difference being that multiplexer/demultiplexer 732 is only connected to bit lines 745 (i.e., there is no read/write control circuit). Therefore, operation of LMC MUX/DEMUX 730 is omitted for brevity.

Fourth Embodiment

FIGS. 8(A) through 8(D) are diagrams showing a CLB 800 in accordance with a fourth embodiment of the present invention. CLB 800 includes a first switch circuit (INPUT MUX) 820, four logic/memory circuits (LMCs) 430-A through 430-D, a second switch circuit (OUTPUT MUX) 860, a register circuit (FFs) 870 and a CLB output multiplexer circuit 875. CLB 800 receives up to twenty-four (24) input signals from eighty (80) interconnect lines of interconnect resources (not shown) that are located adjacent to CLB 800. These input signals are transmitted via CLB input terminals 810 to first switch circuit 820, which also receives up to 12 feedback signals on feedback lines 885. First switch circuit 820 includes programmable switch elements for routing any eight of these input and feedback signals to LMCs 430-A through 430-D via LMC input lines 830. First switch circuit 820 selectively routes these input signals such that, for example, LMC 430-A receives a first group of eight input signals and LMC 430-B receives a second, completely different group of eight input signals.

Each LMC 430-A through 430-D includes programmable circuitry consistent with LMC 430-1 (see FIG. 5(A)), LMC 430-2 (see FIG. 6(A)), or LMC 430-3 (see FIG. 7(A)). Accordingly, the group of eight input signals transmitted on LMC input lines 830 to each LMC 430-A through 430-D includes a first set of four input signals, and a second set of four input signals. Each LMC 430-A through 430-D includes a logic/memory array for storing a plurality of data words that are addressable by the first set of input signals such that a selected word is transmitted on bit lines of the logic/memory array. Each LMC 430-A through 430-D also includes a switch circuit for passing a selected data value from a selected bit line to LMC output lines 850 in response to the second set of input signals. Additional signals, such as control signals CFG, PAL ENBL, READ, and WRITE, as well as data input signal DIN, are either transmitted directly from the surrounding interconnect lines to the LMCs, or are transmitted on additional LMC input lines (not shown). The selected data values transmitted from LMCs 430-A through 430-D via LMC output lines 850 are transmitted to second switch circuit (OUTPUT MUX) 860. Second switch circuit 860 passes the selected data values transmitted from LMCs 430-A through 430-D to twelve output lines 865. Depending upon whether a CLB 800 is utilized as a combinational logic circuit or as a state machine by a user, the data signals on output lines 865 are transmitted to first terminals, or through register circuit (FFs) 870 to second terminals, respectively, of CLB output multiplexer circuit 875. CLB output multiplexer circuit 875 passes one of these sets of signals to CLB output terminals 880 for transmission onto the interconnect lines (not shown), or to feedback lines 885 for transmission back to first switch circuit 820.

Figure 8A:
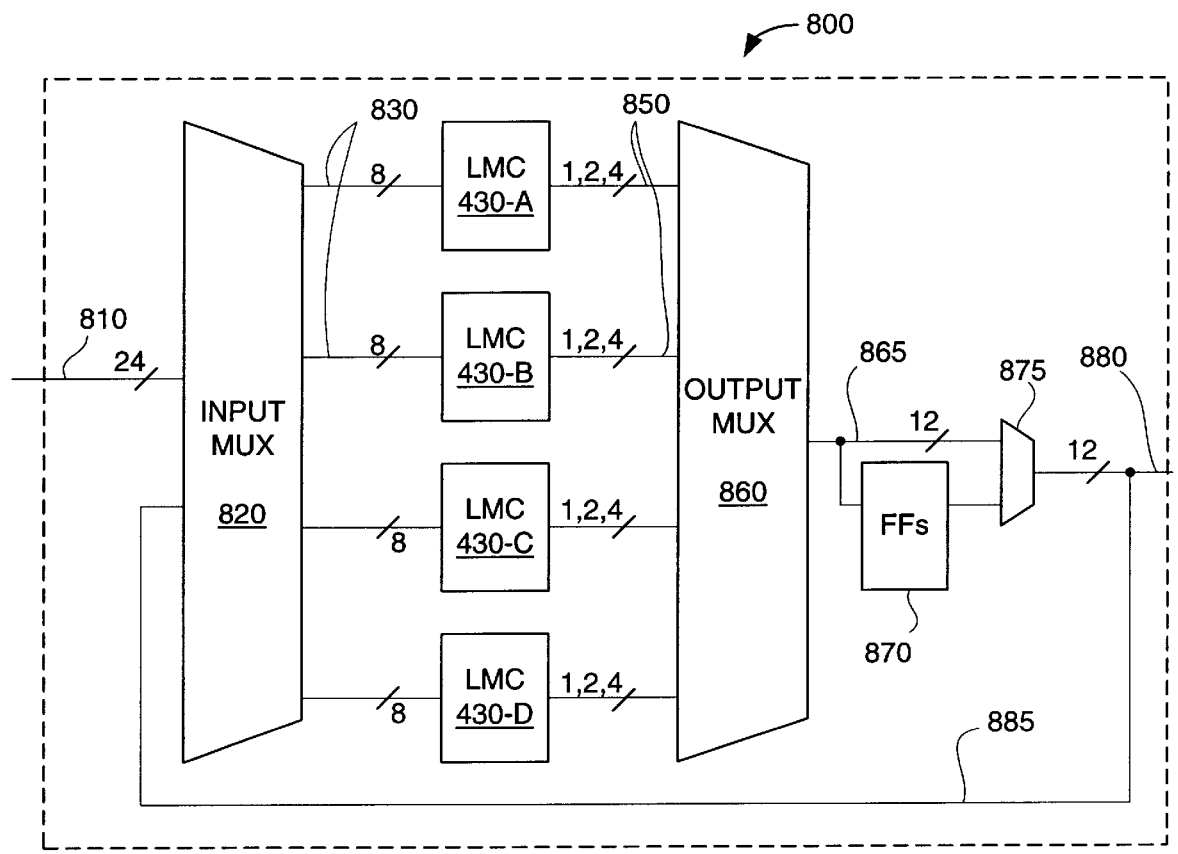
FIGS. 8(A), 8(B), 8(C), and 8(D) are diagrams showing a CLB in accordance with a fourth embodiment of the present invention.
Figure 8B:
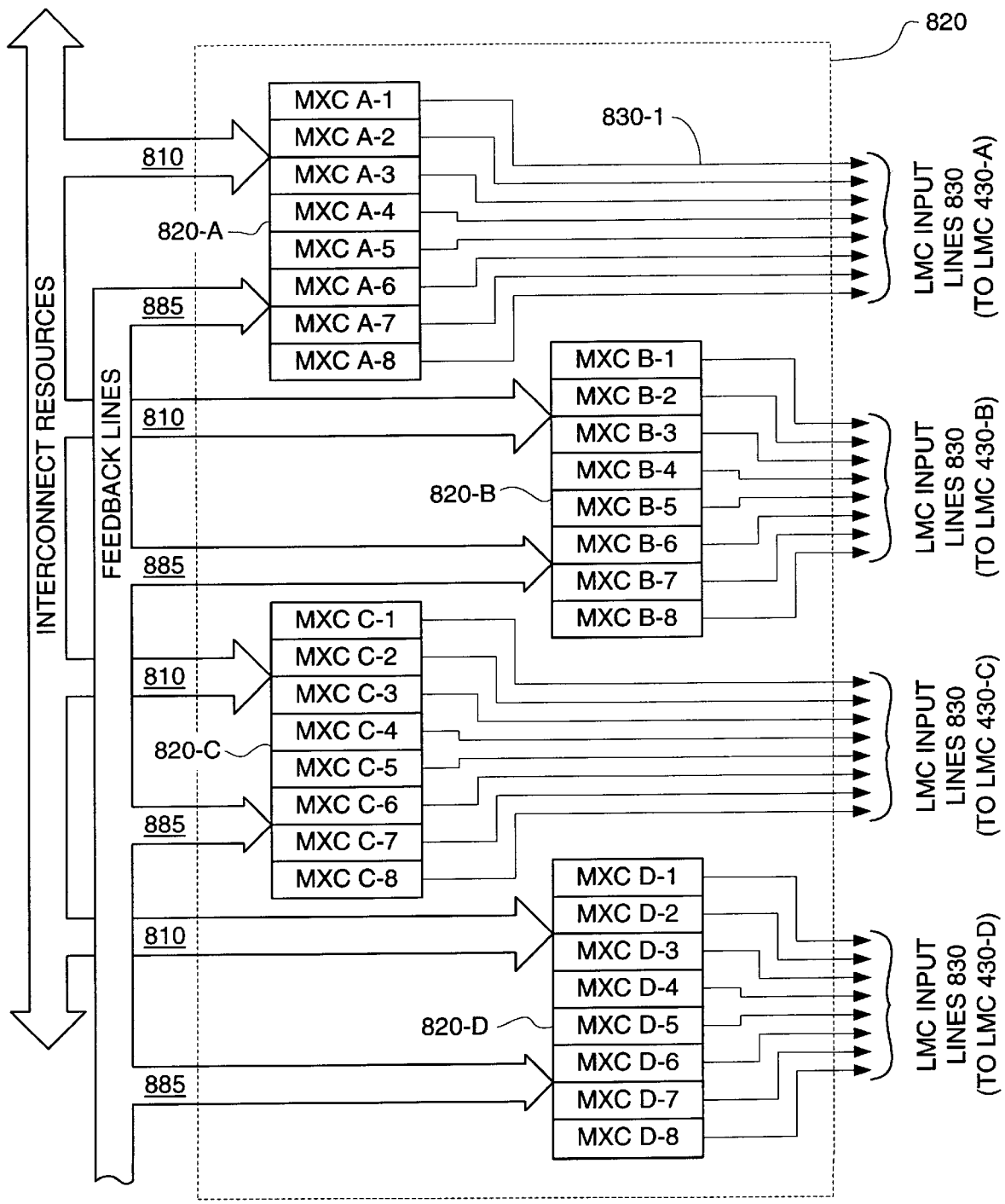
Figure 8C:
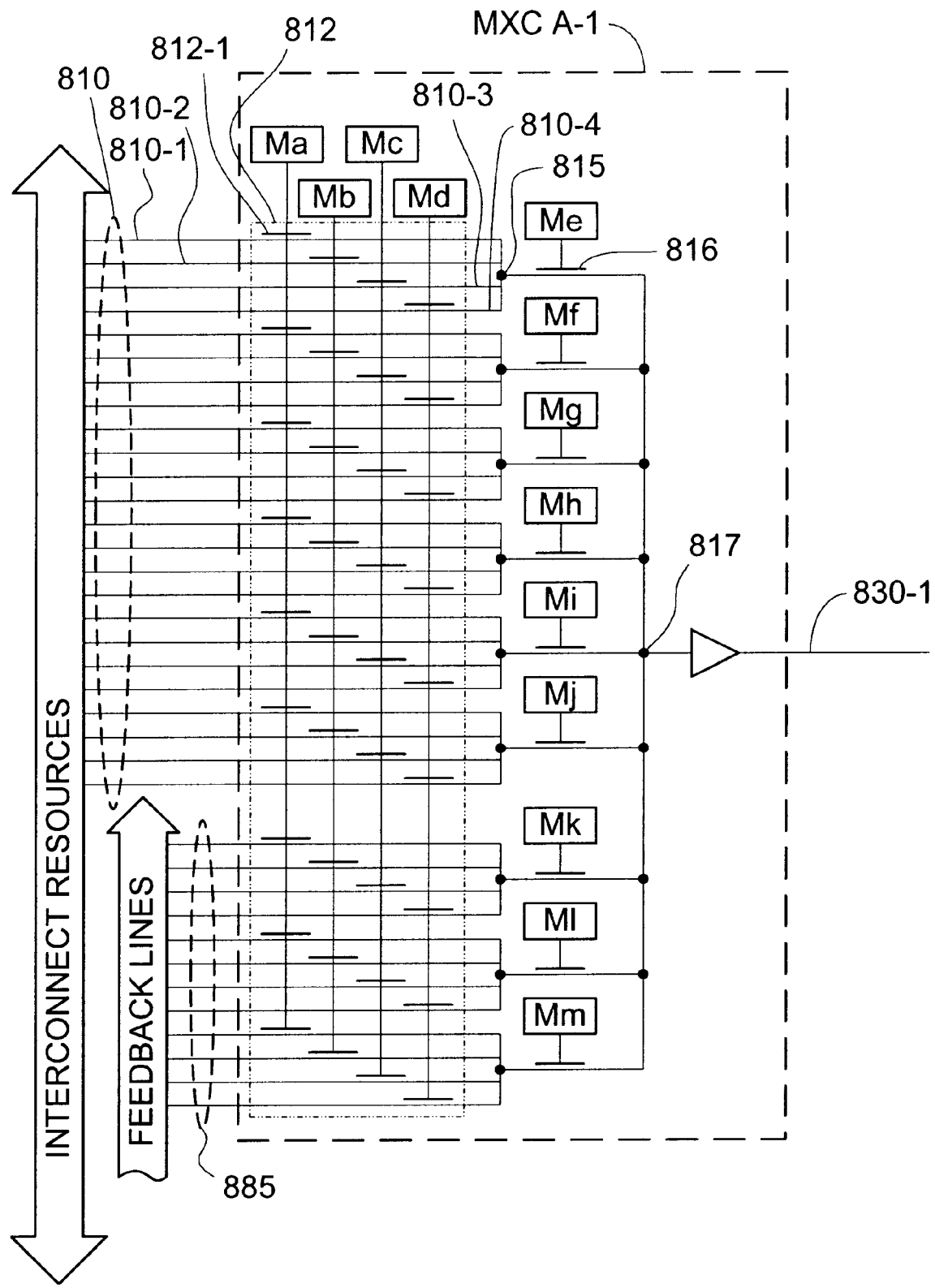
Figure 8D:
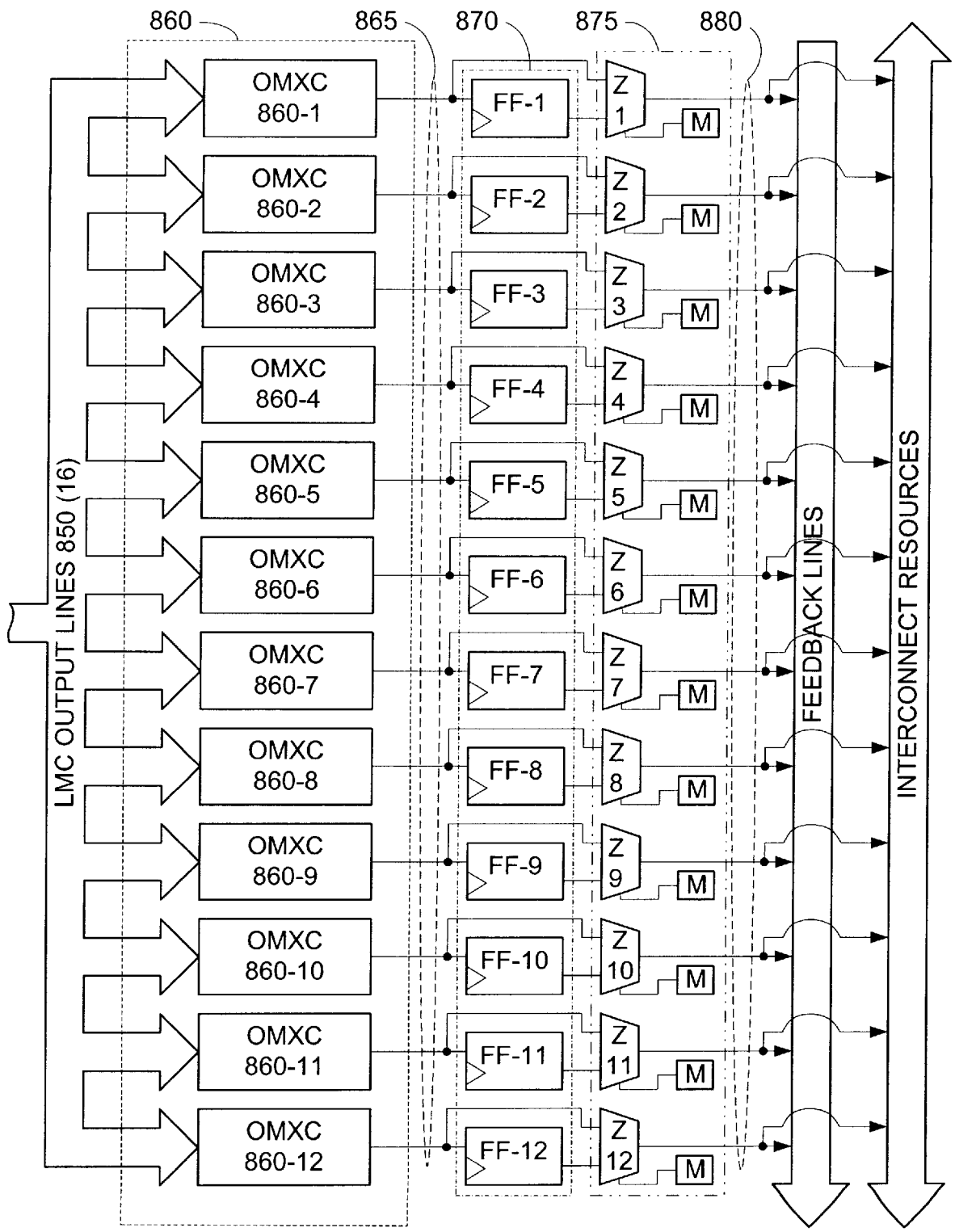

FIGS. 8(B), 8(C), and 8(D) are diagrams showing portions of CLB 800 in additional detail.

FIG. 8(B) is a block diagram showing first switch circuit 820. First switch circuit 820 includes four switch blocks 820-A through 820-D, each switch block including eight multiplexer circuits (MXC). For example, switch block 820-A includes MXC A-1 through MXC A-8. Each switch block 820-A through 820-D receives input signals from interconnect resources on CLB input terminals 810 and feedback signals on feedback lines 885. Each MXC of each switch block 820-A through 820-D includes programmable switching elements for passing a selected signal from CLB input terminals 810 or feedback lines 885 to an associated LMC input line 830. For example, MXC A-1 is programmable to pass one signal selected from either input terminals 810 or feedback lines 885 to LMC input line 830-1.

FIG. 8(C) is a simplified schematic diagram showing the programmable switch elements of MXC A-1, which is representative of all MXCs of switch blocks 820-A through 820-D. MXC A-1 receives twenty-four (24) input signals on CLB input terminals 810 and twelve (12) feedback signals on feedback lines 885. The twenty-four input terminals 810 and twelve feedback lines 885 are collected in groups of four, and each group is programmably connected via pass transistors 812 to a common node. For example, a group of four input terminals 810-1 through 810-4 are connected to common node 815. Input terminal 810-1 is connected to common node 815 via pass transistor 812-1, and input terminals 810-2 through 810-4 are similarly controlled. A first set of four memory elements Ma through Md are connected to the gates of pass transistors 812 and programmed by a user to pass one signal from each group of four input terminals. For example, an input signal from input terminal 810-1 is passed to common node 815 by programming memory element Ma to turn on pass transistor 812-1 (memory elements Mb through Md are programmed to turn off their associated pass transistors). Each common node is in turn connected to an output node 817 via associated pass transistors that are controlled by memory elements Me through Mm. For example, common node 815 is connected to output node 817 via pass transistor 816, which is controlled by memory element Me. Therefore, MXC A-1 is selectively controlled by programming memory elements Ma through Mm to route a selected one of the twenty-four input terminals 810 and twelve feedback lines 885 through output node 817 to LMC input line 830-1.

FIG. 8(D) is a simplified diagram showing the second switch circuit 860, register circuit 870, and CLB output multiplexer circuit 875 of CLB 800. Referring briefly to FIG. 8(A), each LMC 430-A through 430-D generates one, two, or four output signals that are transmitted on LMC output lines 850 to second switch circuit 860. Returning to FIG. 8(D), second switch circuit 860 includes twelve output multiplexer circuits (OMXC) 860-1 through 860-12 connected to LMC output lines 850 such that each OMXC receives all sixteen LMC output signals. Each OMXC 860-1 through 860-12 includes a sixteen-to-one multiplexer that is programmed to pass a selected LMC output signal to an associated output line 865. Output lines 865 are fed to register circuit 870 and to a set of input terminals of CLB output multiplexer circuit 875. Register circuit 870 includes flip-flops FF-1 through FF-12, each having a data terminal connected to receive signals passed on an associated output line 865. Flip-flops FF-1 through FF-12 have output terminals connected to a second set of input terminals of CLB output multiplexer circuit 875. CLB output multiplexer circuit 875 includes twelve two-to-one multiplexers Z1 through Z12 that are controlled by configuration memory cells M to pass either the selected LMC output signal transmitted directly on an associated output line 865, or the registered signal transmitted from an associated flip-flop FF-1 through FF-12. The signal passed by CLB output multiplexer circuit 875 is transmitted to an associated feedback line and to the interconnect resources.

CLB 800 provides an advantage over prior art CLBs in that the sixteen-bit LUTs used in the prior art are replaced by four 256-bit LMCs 430 that implement substantially larger logic function portions while taking up minimal additional space. Increasing the LUT (i.e., LMC) size decreases the number of logic levels so that logic functions are performed at a faster rate than is possible using multiple sixteen-bit LUTs. Further, the additional space necessary for forming 256-bit LMCs is offset by the additional amounts of user logic implemented by each LMC.

Fifth Embodiment

Figure 9A:
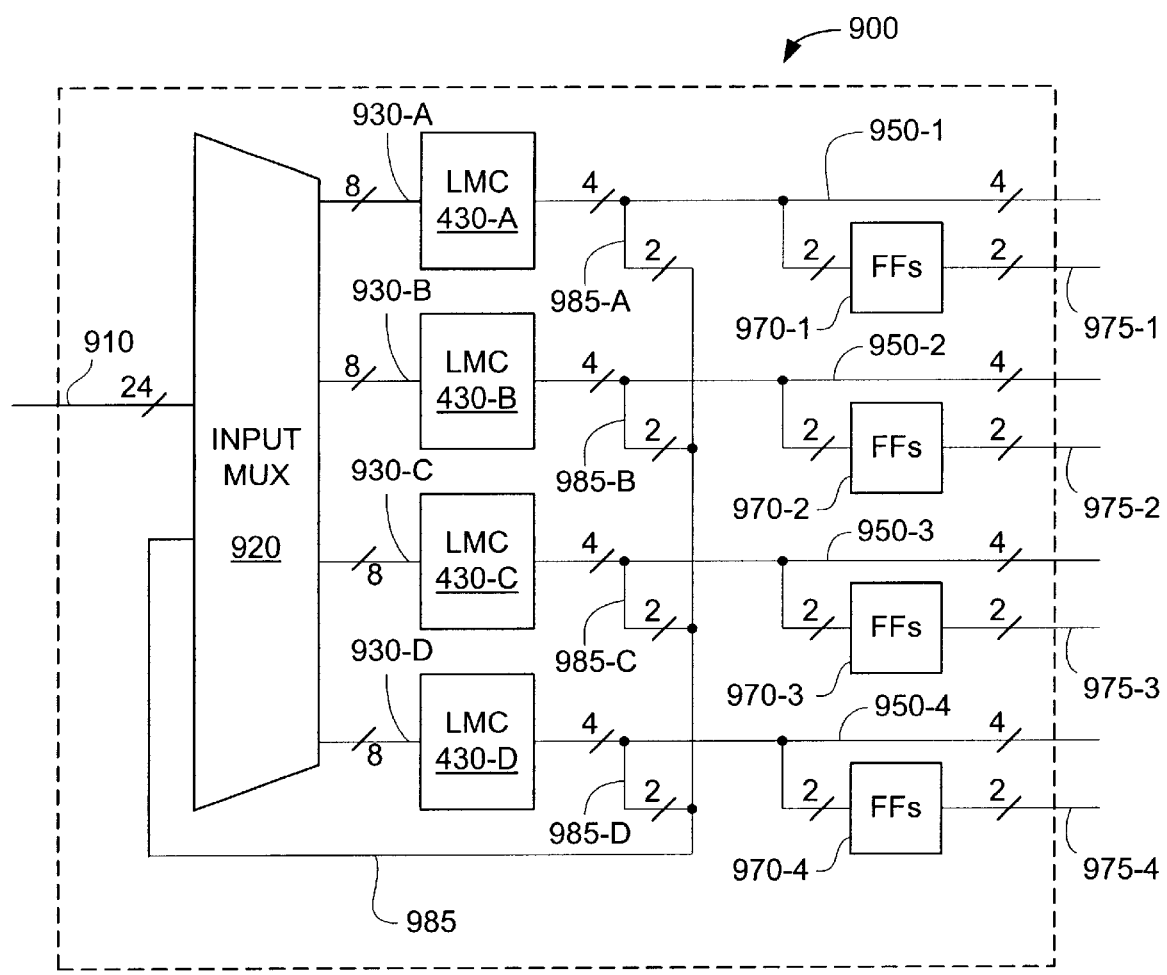
FIGS. 9(A), 9(B), and 9(C) are diagrams showing a CLB in accordance with a fifth embodiment of the present invention.
Figure 9B:
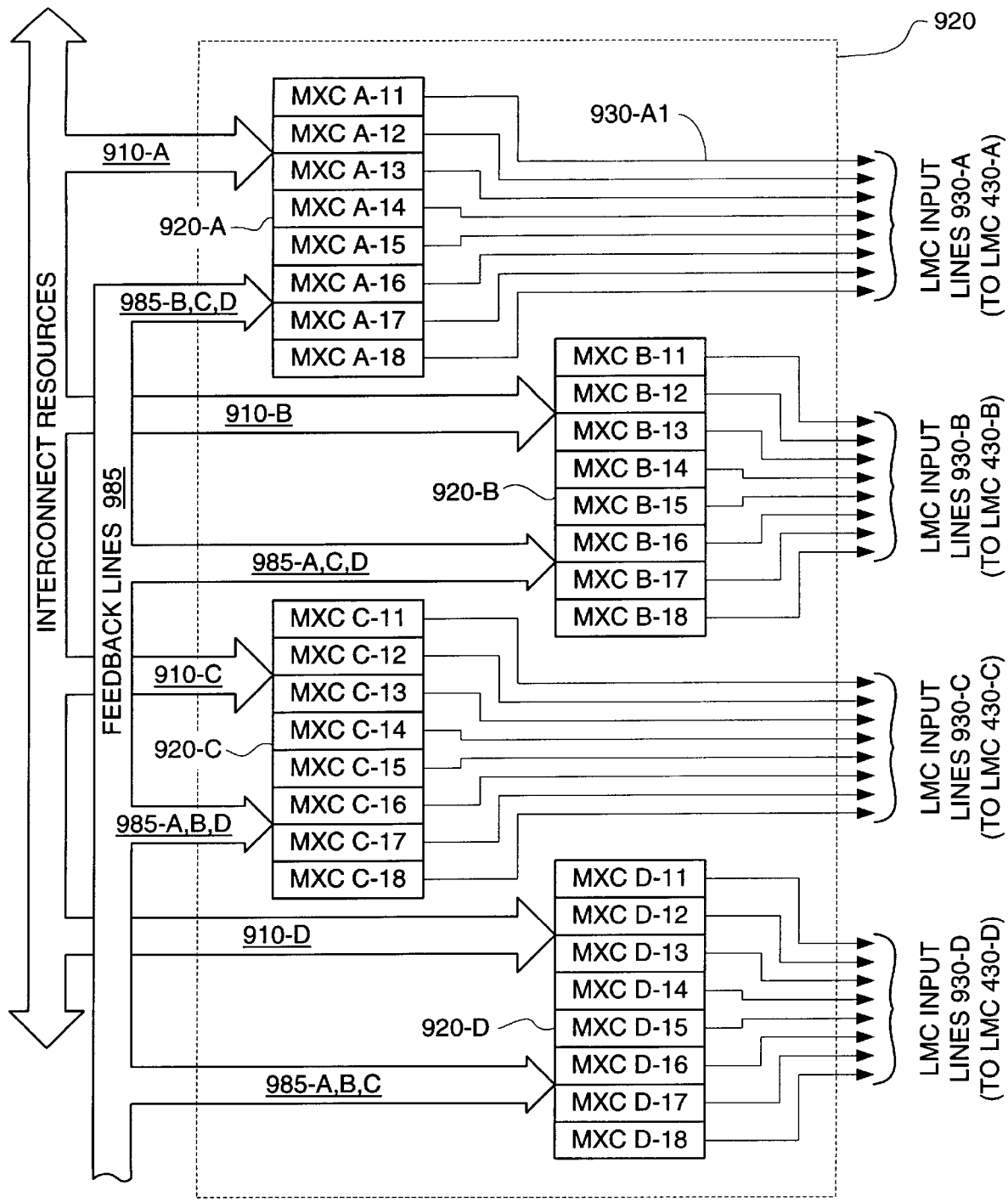
Figure 9C:
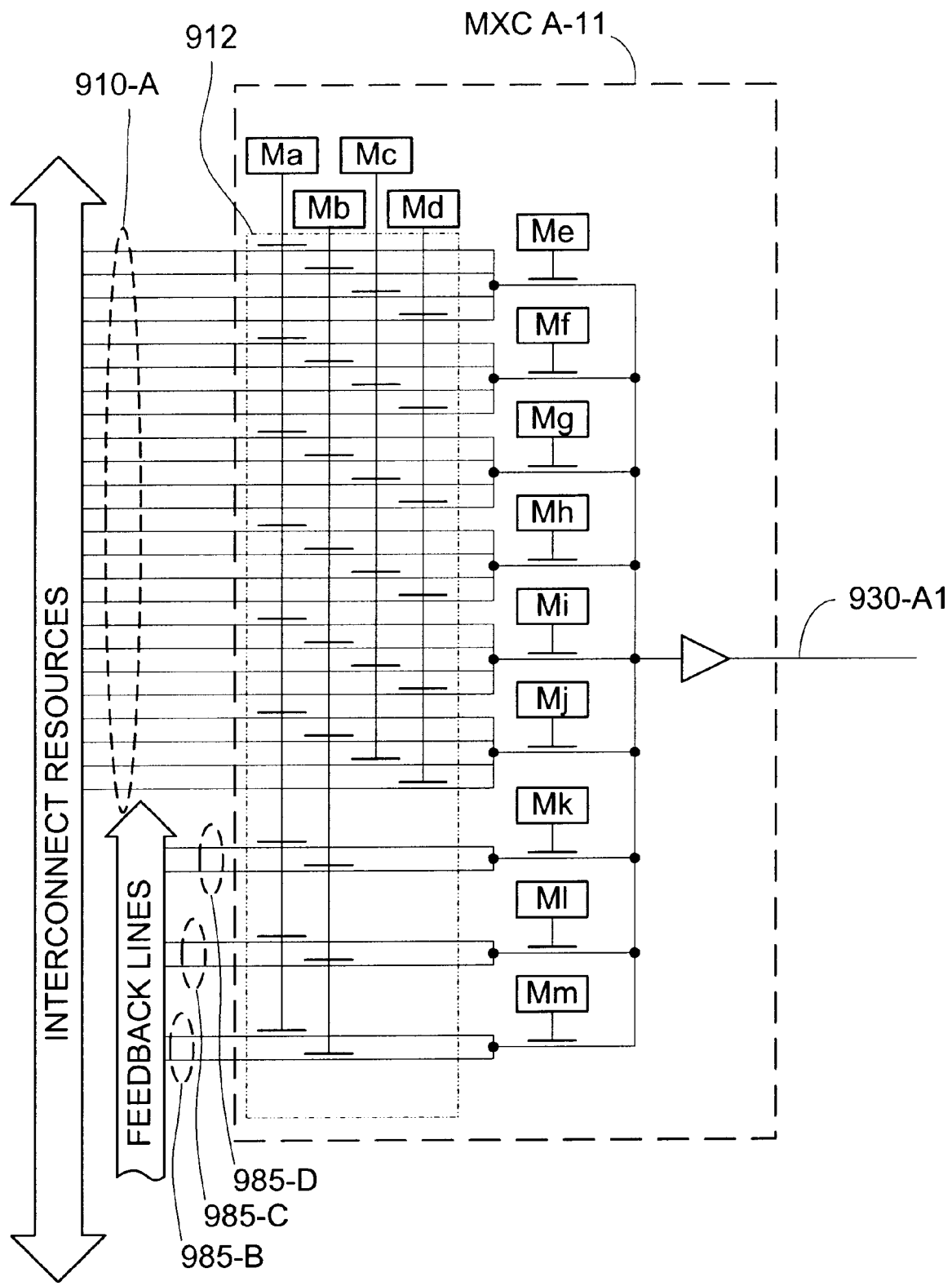

FIGS. 9(A) through 9(C) are diagrams showing a CLB 900 in accordance with a fifth embodiment of the present invention. CLB 900 differs from CLB 800 (see FIG. 8(A)) in that second switch circuit 860 and CLB output multiplexer circuit 875 of CLB 800 are not used in CLB 900. To compensate for the absence of these output control circuits, twenty-four (24) output terminals are provided for transmitting output signals from CLB 900 to the surrounding interconnect resources (not shown), as compared to the twelve provided by CLB 800. Although increasing the number of output terminals requires additional programmable circuitry to provide connections with the interconnect resources, the elimination of the output control circuits reduces signal delays, thereby providing the benefit of faster operating speeds.

CLB 900 includes a switch circuit (INPUT MUX) 920, four logic/memory circuits (LMCs) 430-A through 430-D, and register circuits (FFs) 970-1 through 970-4. CLB 900 receives up to twenty-four (24) input signals on input terminals 910 that are programmably connected to interconnect lines of interconnect resources (not shown) located adjacent to CLB 900 on a host PLD. These input signals are transmitted to switch circuit 920, which also receives eight feedback signals on a feedback line bus 985. Switch circuit 920 includes programmable switch elements for routing any eight of these input and feedback signals to LMCs 430-A through 430-D via LMC input lines 930-A through 930-A.

Each LMC 430-A through 430-D includes programmable circuitry consistent with the LMCs of the present invention; for example, LMC 430-1 (see FIG. 5(A)), LMC 430-2 (see FIG. 6(A)), or LMC 430-3 (see FIG. 7(A)). Accordingly, each LMC 430-A through 430-D includes a switch circuit for providing up to four output signals on CLB output terminals 950-1 through 950-4 in response to the input signals received on LMC input lines 910-A through 910-D. Additional signals, such as control signals CFG, PAL ENBL, READ, and WRITE, as well as data input signal DIN, are either transmitted directly from the surrounding interconnect lines to LMCs 430-A through 430-D, or are transmitted on additional LMC input lines (not shown). Feedback line pairs 985-A through 985-D route feedback signals from associated output terminals 950-1 through 950-4. For example, feedback signals are transmitted on feedback line pair 985-A from two of the four lines making up CLB output terminal 950-1. Feedback line pairs 965-A through 985-D form feedback line bus 985 that is connected to switch circuit 920. When CLB 900 is utilized as a combinational logic circuit by a user, the data signals on CLB output terminals 950-1 through 950-4 are transmitted directly to the interconnect lines (not shown). In contrast, when CLB 900 is utilized as a state machine, signals on two of the four lines associated with each CLB output terminal 950-1 through 950-4 are transmitted to register circuits (FFs) 970-1 through 970-4, which transmit registered output signals on CLB registered output terminals 975-1 through 975-4.

FIGS. 9(B) and 9(C) are diagrams showing switch circuit (INPUT MUX) 920 in additional detail.

FIG. 9(B) is a block diagram of switch circuit 920. Switch circuit 920 includes four switch blocks 920-A through 920-D, each switch block including eight multiplexer circuits (MXC). For example, switch block 920-A includes MXC A-11 through MXC A-18. Each switch block 920-A through 920-D receives twenty-four (24) input signals from interconnect resources on associated CLB input terminals 910-A through 910-D, respectively, and six (6) feedback signals on feedback line bus 985. Each multiplexer circuit MXC of each switch block 920-A through 920-D includes programmable switching elements for passing a selected signal from CLB input terminals 910-A through 910-D, or feedback signals from feedback line bus 985, to an associated line of LMC input lines 930-A through 930-D. For example, MXC A-11 is programmable to pass one signal either from the twenty-four lines of CLB input terminal 910-A or from six feedback lines of feedback line bus 985 to LMC input line 930-A1, which is then transmitted to LMC 430-A (see FIG. 9(A)).

Note that only six of the eight feedback lines of feedback line bus 985 are routed to each switch block 920-A through 920-D. In the pictured embodiment, output signals from one of the LMCs are not utilized as feedback by that LMC. Therefore, the feedback line pairs of feedback line bus 985 that are connected to the output terminals of an LMC are not fed back to the switch block associated with that LMC. For example, as shown in FIG. 9(B), switch block 920-A receives feedback signals from feedback line pairs 985-B, 985-C, and 985-D (respectively generated by LMCs 430-B, 430-C, and 430-D). Therefore, feedback line pairs 985-A are not transmitted to switch block 920-A. Similarly, switch block 920-B receives feedback signals from feedback line pairs 985-A, 985-C, and 985-D, switch block 920-C receives feedback signals from feedback line pairs 985-A, 985-B, and 985-D, and switch block 920-D receives feedback signals from feedback line pairs 985-A, 985-B, and 985-C.

FIG. 9(C) is a simplified schematic diagram showing the programmable switch elements of MXC A-11, which is representative of all multiplexer circuits of switch blocks 920-A through 920-D. MXC A-11 receives twenty-four (24) input signals on CLB input terminals 910-A and six (6) feedback signals from feedback line pairs 985-B, 985-C, and 985-D. The twenty-four input signals are transmitted in groups of four via pass transistors 912. A first set of four memory elements Ma through Md is connected to the gates of pass transistors 912 and is programmed by a user to pass one signal from each group of four input signals. Similarly, the six feedback signals are transmitted in groups of two via pass transistors 912. Memory elements Ma and Mb control these pass transistors to pass one signal from each group of two feedback signals. A selected input signal or feedback signal from one of these groups is passed via associated pass transistors that are controlled by memory elements Me through Mm to LMC input line 930-A1. Therefore, MXC A-11 is selectively controlled by programming memory elements Ma through Mm to route a selected one of the twenty-four input signals from input terminal 910-A and six feedback signals from feedback line pairs 985-B, 985-C, and 985D to LMC 430-A via LMC input line 930-A1.

Referring again to FIG. 9(A), each LMC 430-A through 430-D generates from one, two, or four output signals that are transmitted on CLB output terminals 950-1 through 950-4 to the surrounding interconnect resources (not shown). Alternatively, two signals from each CLB output terminal 950-1 through 950-4 can be provided from CLB 900 as registered output signals transmitted from register circuits 970-1 through 970-4 on CLB registered output terminals 975-1 through 975-4.

Sixth Embodiment

Although CLB 800 and CLB 900 include four LMCs 430 to perform logic/memory functions, special purpose circuits and other logic circuits may be utilized in conjunction with LMCs to provide additional logic capability with a minimal increase in circuit size.

Figure 10:
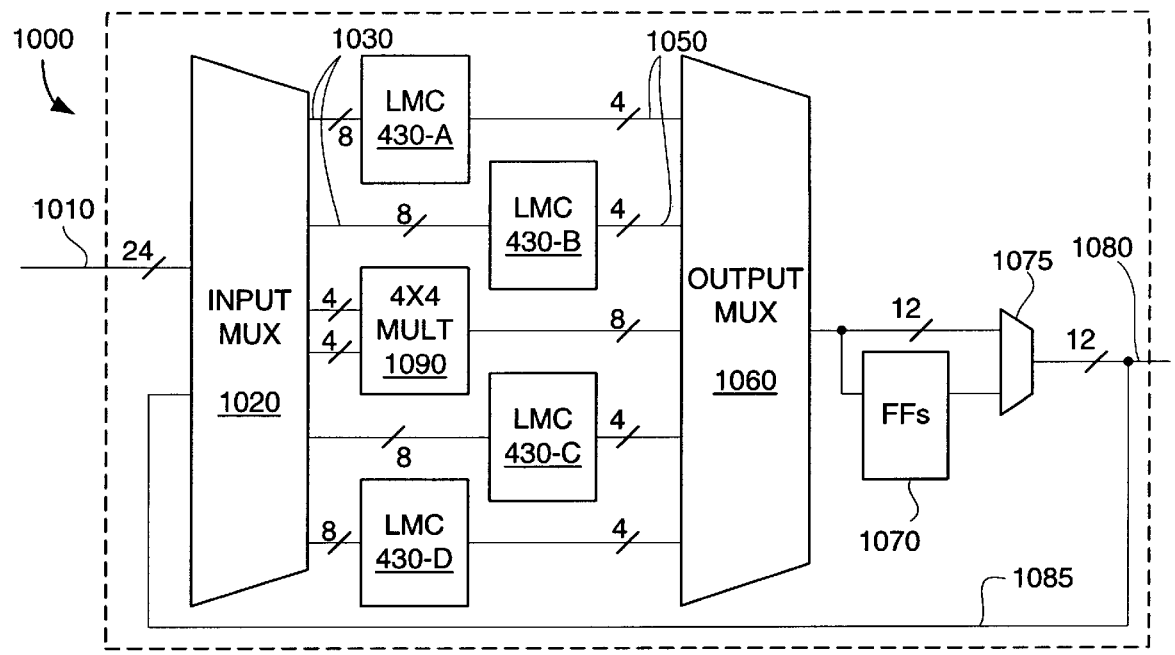
FIG. 10 is a block diagram showing a CLB in accordance with a sixth embodiment of the present invention.

FIG. 10 is a block diagram showing a CLB 1000 in accordance with a sixth embodiment of the present invention. Similar to CLB 800 (FIG. 8(A)), CLB 1000 includes a first switch circuit (INPUT MUX) 1020, four logic/memory circuits (LMCs) 430-A through 430-D, a second switch circuit (OUTPUT MUX) 1060, a register circuit (FFs) 1070, and a CLB output multiplexer circuit 1075. In addition, CLB 1000 includes a four-by-four array multiplier circuit 1090 that receives a total of eight input signals from first switch circuit 1020, and generates eight output signals that are transmitted to second switch circuit 1060. Suitable four-by-four array multiplier circuits are taught, for example, in Principles of CMOS VLSI Design, Second Edition, by Neil Weste and Kamran Eshraghian (Addison-Wesley, 1993), pages 545 to 547. Multiplier circuits are substantially smaller in size than the general-purpose circuitry of LMC 430, and are often used in DSP applications. By providing multiplier circuit 1090, CLB 1000 improves multiplication speeds for these applications by three times or more.

Seventh Embodiment

Figure 11:
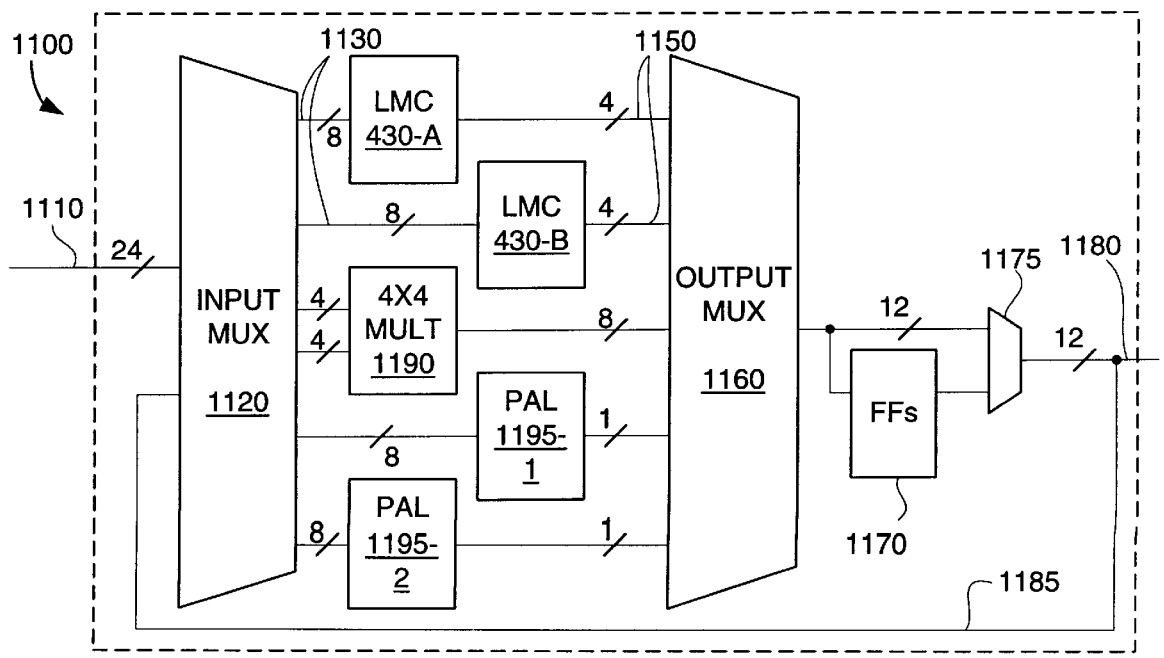
FIG. 11 is a block diagram showing a CLB in accordance with a seventh embodiment of the present invention.

FIG. 11 is a block diagram showing a CLB 1100 in accordance with a seventh embodiment of the present invention. Similar to CLB 1000 (FIG. 10), CLB 1100 includes logic/memory circuits (LMCs) 430-A and 430-B for performing general purpose logic operations, and includes a four-by-four array multiplier circuit 1190 for performing multiplication operations. In the seventh embodiment, LMCs 430-A and 430-B are implemented using, for example, LMC 430-1 (FIG. 5(A)), which only performs LUT and RAM functions. In addition, two dedicated PAL circuits 1195-1 and 1195-2 are provided to implement logic function portions using the AND-OR logic format. Dedicated PAL circuits are well-established, and, as discussed above, are typically faster than LUT circuits. By incorporating both the large capacity of LMCs 430 with the high speed of dedicated PAL circuits in a single CLB 1100, a highly versatile PLD is produced that can implement both high speed and large capacity logic functions.

Eighth Embodiment

As described above, the logic/memory arrays of LMCs 430-1 (FIG. 5(A)), 430-2 (FIG. 6(A)), and 430-3 (FIG. 7(A)) include 256 programmable elements arranged in a sixteen-by-sixteen matrix. While this arrangement provides for high capacity LUT implementations of any eight-input logic function, it also reduces the operating speed of these LMCs. Specifically, the sixteen programmable elements connected to each bit line create a significant load on each bit line. As mentioned above, the "fast read" arrangement disclosed in the logic/memory arrays of LMC 430-1 (see FIG. 5(C)) and 430-2 (see FIG. 6(C)) produces a relatively faster operating speed than that provided by LMC 430-3 (see FIG. 7(C)). However, even when the "fast read" arrangement is used, the load produced by sixteen programmable elements on each "fast read" bit line contributes significantly to signal delays. Consequently, to further increase the operating speed, programmable elements may be eliminated from each bit line in the logic/memory array. While removing programmable elements from the logic/memory array sacrifices LUT and RAM capacity, the resulting increase in operating speed is highly beneficial for high speed logic implementations.

Figure 12A:
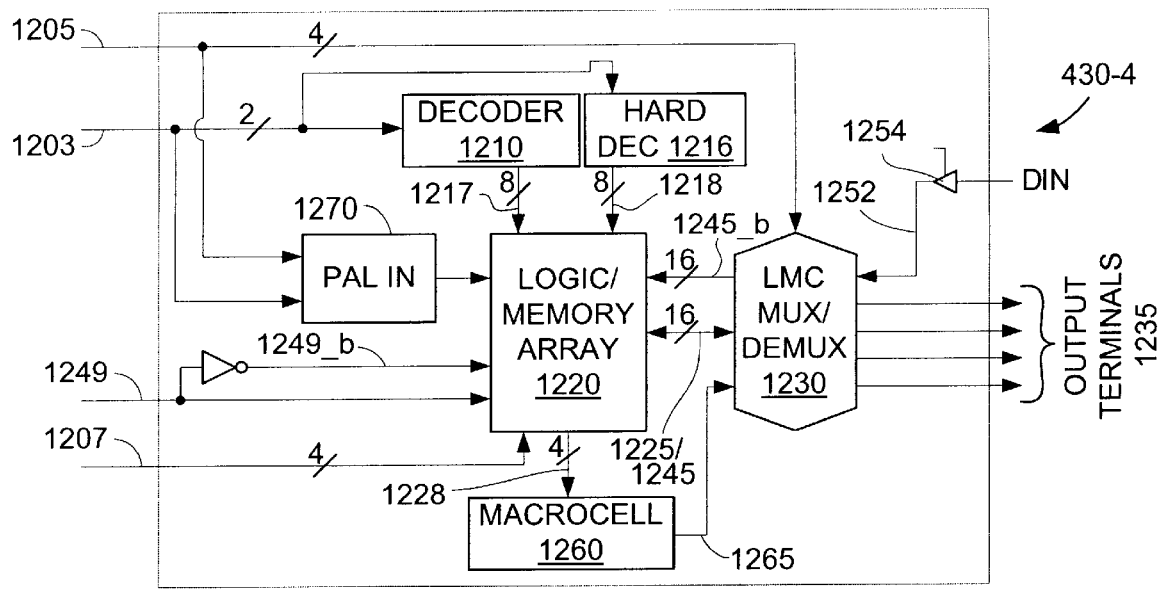
FIGS. 12(A), 12(B), and 12(C) are diagrams showing portions of an LMC according to an eighth embodiment of the present invention.
Figure 12B:
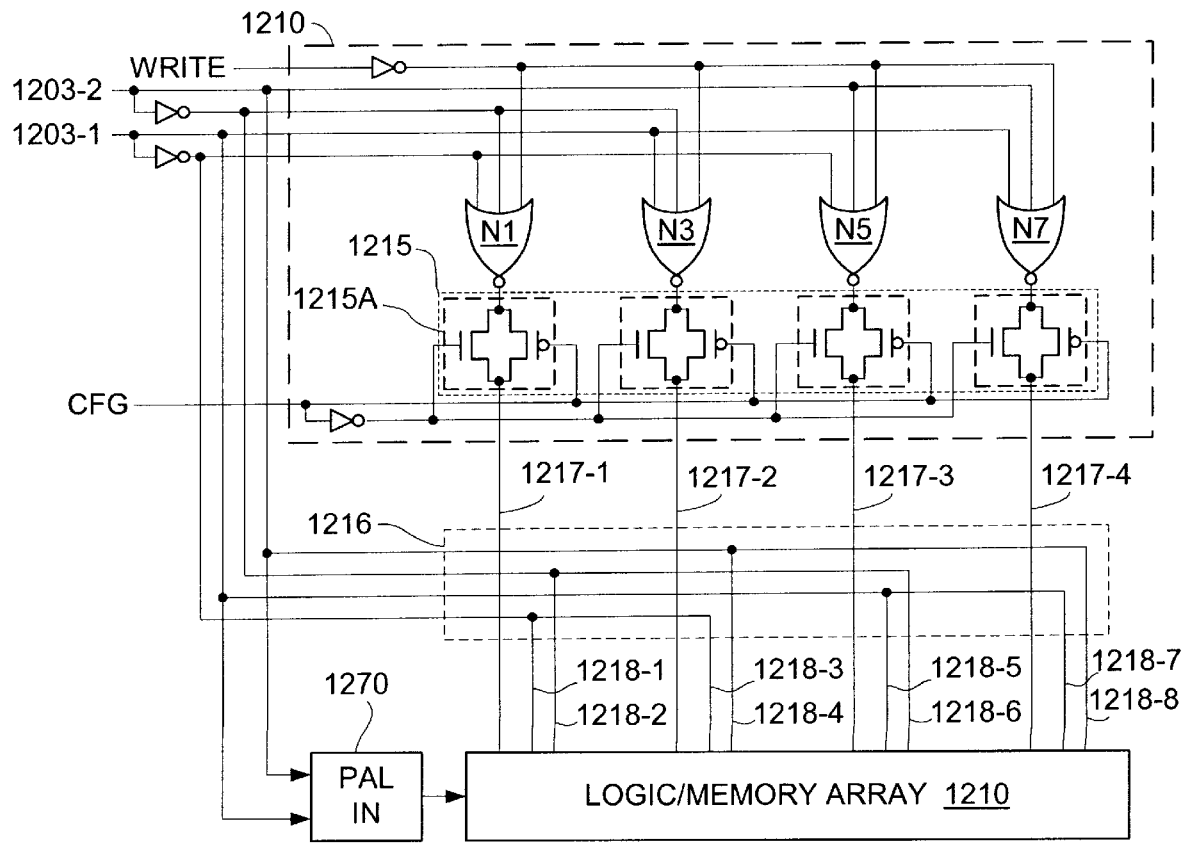
Figure 12C:
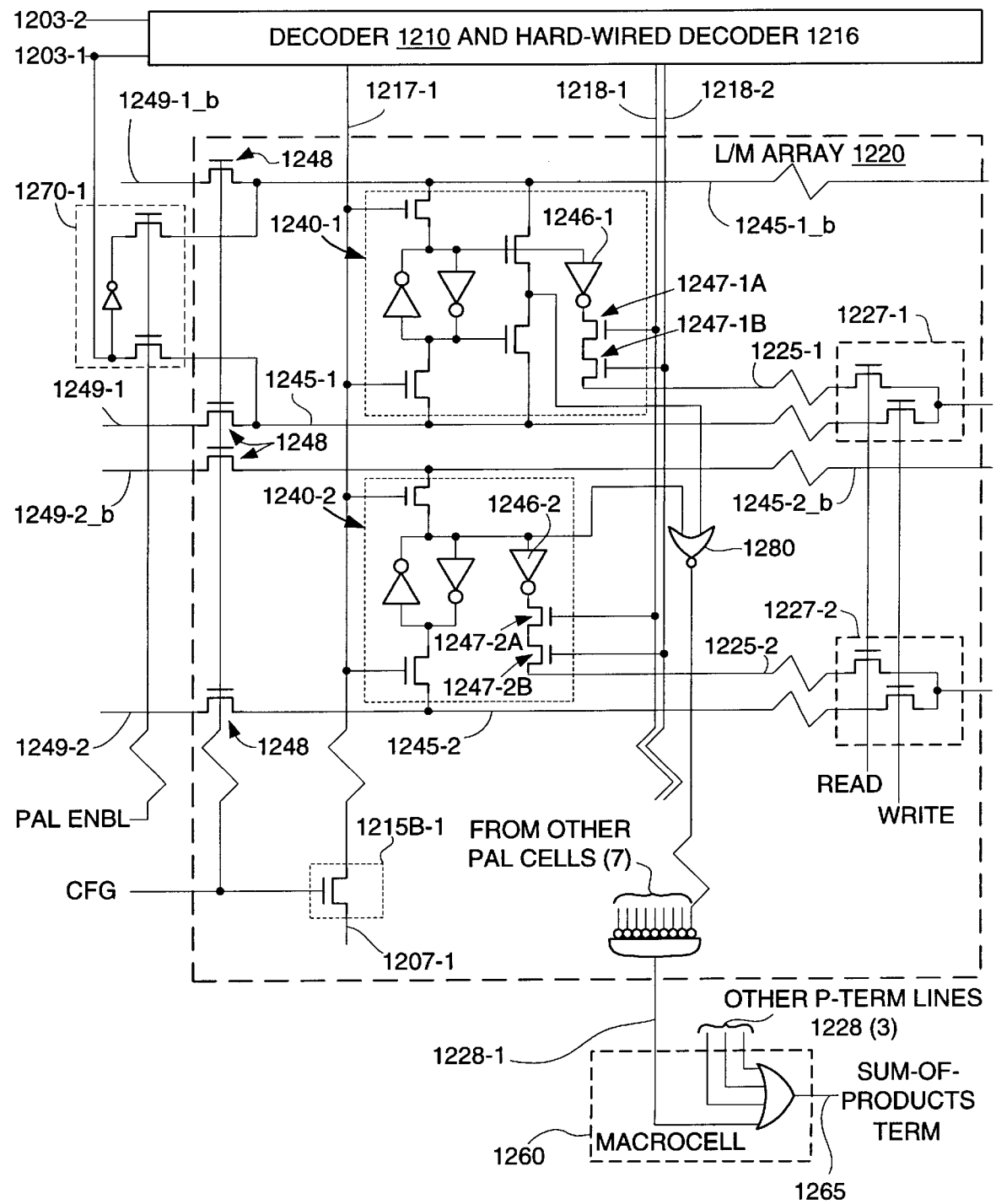

FIGS. 12(A) through 12(C) show an LMC 430-4 in accordance with an eighth embodiment of the present invention. Similar to LMC 430-2 (FIG. 6(A)), the programmable elements of LMC 430-4 can be selectively utilized as a LUT, a RAM, or a PAL/CAM. However, unlike LMC 430-2, the logic/memory array of LMC 430-4 includes only 64 bits arranged in sixteen rows and four columns. As such, LMC 430-4 is capable of implementing six-input LUT operations (as opposed to the eight-input LUT operations of LMC 430-2), and is capable of implementing 64-bit RAM operations (as opposed to 256 bits). However, by reducing the number of programmable elements in each row of the logic/memory array, significantly less capacitance is applied on each read bit line, thereby increasing the operating speed during the memory read (LUT operation and RAM read) mode. In addition, by reducing the number of columns to four, a hard-wired decoder can be utilized to further increase the operating speed during the memory read mode.

Referring to FIG. 12(A), LMC 430-4 includes a decoder 1210, a hard-wired decoder (HARD DEC) 1216, a logic/memory array 1220, a LMC multiplexer/demultiplexer (MUX/DEMUX) (switch circuit) 1230, a macrocell 1260, and a PAL input (PAL IN) control circuit 1270. Decoder 1210 is connected to receive two input signals from a first set of four input terminals 1203, and generates four write address signals on write word lines 1217 that are transmitted to the columns of programmable elements of logic/memory array 1220. Hard-wired decoder 1216 is also connected to receive the same two input signals from input terminals 1203, and generates eight read address signals on read word lines 1218, two read address signals being transmitted to each column of logic/memory array 1220. Logic/memory array 1220 also receives four configuration address signals on lines 1207 from a configuration bus (not shown). Control circuitry (discussed below) is provided to apply either the address signals generated by decoder 1210 onto write word lines 1217 during memory write operations, or to apply the configuration address signals onto write word lines 1217 during the configuration mode. LMC MUX/DEMUX 1230 is responsive to input signals received by input terminals 1205 to pass bit values from selected read bit lines 1225 to output terminals 1235 during the memory read mode. In addition, LMC MUX/DEMUX 1230 is responsive to the input signals to transmit input data values from data input terminal DIN to selected write bit lines 1245 and inverted write bit lines 1245_b during the memory write mode.

FIG. 12(B) shows a simplified decoder 1210 and hard-wired decoder 1216 that decode the two input signals received on input terminals 1203-1 and 1203-2. Each input signal is inverted, and selected pairs of the inverted and non-inverted input signals are applied to the input terminals of four NOR gates N1, N3, N5, and N7 of decoder 1210, which also receive an inverted WRITE control signal. In response to the selected pairs of input signals and the WRITE control signal, NOR gates N1, N3, N5, and N7 generate write address signals that are applied to four columns of programmable elements in logic/memory array 1220 via a switch circuit 1215. The inverted and non-inverted input signals are also utilized by hard-wired decoder 1216, which provides selected pairs of the inverted and non-inverted input signals on read lines 1218-1 through 1218-8 to the four columns of programmable elements in logic/memory array 1220.

Referring again to FIG. 12(A), logic/memory array 1220 includes 64 programmable elements arranged in sixteen rows and four columns. Each column includes sixteen programmable elements arranged to form eight pairs (referred to below as "PAL/CAM cells"). A representative pair of programmable elements from one column of logic/memory array 1220 is shown in FIG. 12(C). The remaining pairs of programmable elements of logic/memory array 1220 are essentially identical to the pair shown in FIG. 12(C).

FIG. 12(C) shows one PAL/CAM cell formed by programmable elements 1240-1 and 1240-2 that are arranged sequentially in one column of logic/memory array 1220. Similar to programmable elements 640-1 and 640-2 described above with reference to FIG. 6(C), each programmable element 1240-1 and 1240-2 includes a latch for storing a bit value, and control circuitry for controlling the process of writing bit values to each latch from write bit lines 1245-1, 1245-1_b, 1245-2, and 1245-2_b. In addition, programmable elements 1240-1 and 1240-2 include third inverters 1246-1 and 1246-2 for driving bit values onto read bit lines 1225-1 and 1225-2, respectively. Programmable element 1240-1 differs from programmable element 640-1 (FIG. 6(C)) in that memory read operations are controlled by two series pass transistors 1247-1A and 1247-1B, with gates that are connected to read word lines 1218-1 and 1218-2, respectively. Specifically, the bit value stored by the latch of programmable element 1240-1 is transmitted to read bit line 1225-1 only when high address signals are applied to both read word lines 1218-1 and 1218-2, thereby turning on both pass transistors 1247-1A and 1247-1B. Referring briefly to FIG. 12(B), read word lines 1218-1 and 1218-2 receive high address signals only when the input signals received at both of input terminals 1203-1 and 1203-2 are low (i.e., the inverted input signals applied to read word lines 1218-1 and 1218-2 are high). Similarly, memory read operations for programmable element 1240-2 are controlled by two series pass transistors 1247-2A and 1247-2B, with gates that are also connected to read word lines 1218-1 and 1218-2, respectively.

Because logic/memory array 1220 includes only four columns of programmable elements, the formation of hard-wired decoder 1216 and the addition of a second pass transistor for memory read operations do not introduce significant complexity to logic/memory array 1220. Further, the decoder delay eliminated by hard-wired decoder 1216 is greater than the additional delay caused by transmitting bit values through the series pass transistors, thereby resulting in a net increase in operating speed. Operating speed of LMC 430-4 is further increased because only four programmable elements are connected to each bit line. Therefore, LMC 430-4 operates at significantly faster operating speeds in the memory read (LUT operation and RAM read) mode than that provided by LMCs having sixteen-by-sixteen logic/memory arrays.

Other than the modified memory read operation of programmable elements 1240-1 and 1240-2, the operation of LMC 430-4 is similar to that described above with reference to LMC 430-2. In addition, LMC MUX/DEMUX 1230 is essentially identical to LMC MUX/DEMUX 630 (see FIG. 6(D)). Therefore, description of LMC MUX/DEMUX 1230 and the configuration, PAL/CAM, and memory write modes are omitted herein for brevity.

Although the present invention has been described in considerable detail with reference to certain preferred embodiments thereof, other embodiments are possible. For example, in another embodiment the memory cells of LMC 430-1 are arranged as a sixteen-by-four matrix (similar to that utilized in LMC 430-4, described above), and a decoder arrangement is provided including a hard-wired decoder (similar to hard-wired decoder 1216; see FIG. 12(B)). By combining the hard-wired decoder 1216 with the high-speed memory read circuitry of LMC 430-1, a logic/memory circuit is provided that performs extremely fast read operations. In yet another embodiment, CLB 800 or 900 may receive more than 24 input signals. Further, the LMCs disclosed herein may include logic/memory arrays having larger numbers of programmable elements to support LUTs of nine or more inputs, but such LMCs would be sub-optimal because of the problems associated with partitioning logic functions to utilize nine (or more) input LUTs. Moreover, instead of the 1:1 input-to-output ratio of the multiplier circuit used in CLBs 1000 and 1100, an adder circuit having a 2:1 input-to-output ratio, or another special-purpose circuit, may be used. Therefore, the spirit and scope of the appended claims should not be limited to the description of the preferred embodiments contained herein.

We claim:

1. A programmable logic device including a plurality of configurable logic blocks and interconnect resources for transmitting signals to the configurable logic blocks, each configurable logic block including a logic/memory circuit comprising:

a first plurality of input terminals for receiving a first set of input signals from the interconnect resources;

a decoder for generating address signals in response to the first plurality of input signals;

an array including programmable elements for storing a plurality of bit values, word lines connected to the decoder for receiving the address signals, and bit lines for transmitting bit values to the programmable elements in response to the address signals;

an input control circuit connected to the first plurality of input terminals for selectively transmitting the first set of input signals onto a group of the bit lines; and a product term circuit for generating a plurality of product terms in response to the first set of input signals transmitted on the group of the bit lines and the bit values stored in the programmable elements.

2. The programmable logic device according to claim 1, wherein the input control circuit includes a first pass transistor connected between a first input terminal and a first bit line, an inverter having an inverter input terminal connected to the first input terminal, and a second pass transistor connected between an output terminal of the inverter and a second bit line; and wherein the first and second pass transistors are controlled by a control signal to turn on such that an input signal is passed to the first and second bit lines during a first operating mode, and to turn off such that the input signal is isolated from the first and second bit lines during a second operating mode.

3. The programmable logic device according to claim 1, wherein the logic/memory circuit further comprises:

a second group plurality of input terminals for receiving a second set of input signals;

a data input terminal for receiving a write bit value from the interconnect resources; and a multiplexing/demultiplexing circuit connected to the bit lines, wherein the multiplexing/demultiplexing circuit is selectively controllable to pass a selected bit value read from the programmable elements in response to the second set of input signals in a first mode, and controllable to pass the write bit value from the data input terminal to a selected bit line in response to the second set of input signals in a second mode.

4. The programmable logic device according to claim 1, wherein the logic/memory circuit further comprises a macrocell circuit for generating a sum-of-products value in response to the plurality of product terms.

5. The programmable logic device according to claim 1, wherein the decoder comprises:

a first input terminal for receiving a first input signal;

a second input terminal for receiving a second input signal;

a write control terminal for receiving a write control signal;

a first logic gate for generating a first write address signal in response to the first and second input signals and the write control signal; and a second logic gate for generating a first read address signal in response to the first and second input signals.

6. The programmable logic device according to claim 5, wherein the decoder further comprises:

a fourth input terminal for receiving a configuration control signal; and a write control circuit for passing the first write address signal to the array in response to the configuration control signal.

7. The programmable logic device according to claim 5, wherein the programmable elements of the array are arranged in rows and columns, each row of programmable elements being connected to an associated write bit line and an associated read bit line, each column of programmable elements being connected to an associated write word line and an associated read word line;

wherein the first write address signal generated by the first logic gate is transmitted onto a first write word line; and wherein the first read address signal generated by the second logic gate is transmitted onto a first read word line.

8. The programmable logic device according to claim 7, wherein each programmable element of the array comprises:

a latch for storing a bit value;

a write transistor having a first terminal connected to the write bit line, a second terminal connected to the latch, and a gate connected to the write word line;

an inverter having an input terminal connected to the latch and an output terminal; and a read transistor having a first terminal connected to the read bit line, a second terminal connected to the output terminal of the inverter, and a gate connected to the read word line.

9. The programmable logic device according to claim 7, further comprising:

a read/write control circuit having a first pass transistor connected to a first write bit line, a second pass transistor connected to a first read bit line, and an output terminal connected to the first and second pass transistors; and a multiplexing/demultiplexing circuit connected to the output terminal of the read/write control circuit, the multiplexing/demultiplexing circuit having an output terminal and a data input terminal, wherein the read/write control circuit and the multiplexing/demultiplexing circuit are selectively controllable to pass a bit value from the first read bit line to the output terminal of the multiplexing/demultiplexing circuit in a first mode, and controllable to pass a write bit value from the data input terminal to the first write bit line in a second mode.

10. The programmable logic device according to claim 9, wherein the logic/memory circuit further comprises a macrocell circuit for generating a sum-of-products value in response to the plurality of product terms, and wherein the multiplexing/demultiplexing circuit comprises:

a multiplexer circuit for selectively passing the bit value from the first read bit line; and an output control circuit for transmitting either the bit value or the sum-of-products value from the macrocell circuit to the output terminal of the multiplexing/demultiplexing circuit.

11. The programmable logic device according to claim 10, wherein the multiplexing/demultiplexing circuit further comprises:

a first plurality of two-input multiplexers including a first multiplexer having a first input terminal selectively connected to the first write bit line and the first read bit line, and a second input terminal selectively connected to a second write bit line and a second read bit line, a second plurality of two-input multiplexers including a second multiplexer having an input terminal connected to an output terminal of the first multiplexer and further including a third multiplexer, a third plurality of two-input multiplexers including a fourth multiplexer having a first input terminal connected to an output terminal of the second multiplexer, and a second input terminal connected to an output terminal of the third multiplexer, and a fifth multiplexer having an input terminal connected to an output terminal of the third multiplexer; and wherein the output control circuit comprises a sixth two-input multiplexer for selectively passing a first bit value from one of the second multiplexer and the fourth multiplexer to a first output terminal, and further comprises a seventh two-input multiplexer for selectively passing a second bit value from one of the third multiplexer and the fifth multiplexer to a second output terminal.

12. The programmable logic device according to claim 1, wherein the input control circuit comprises a first transistor for selectively applying a first input signal onto a first bit line and a second transistor for applying an inverted form of the first input signal onto a second bit line;

wherein the array comprises:
a first programmable element having a latch for storing a first bit value,
a first pass transistor having a first terminal connected to the first bit line, a second terminal connected to a node, and a gate connected to the latch of the first programmable element,
a second pass transistor having a first terminal connected to the second bit line, a second terminal connected to the node, and a gate connected to the latch of the first programmable element, and
a second programmable element having a latch for storing a second bit value; and wherein the product term circuit comprises:
a cell logic circuit having a first input terminal connected to the node and a second input terminal connected to the latch of the second programmable element, and
an AND circuit for generating a product term in response to an output signal generated by the cell logic circuit.

13. The programmable logic device according to claim 1, wherein the decoder comprises:
a first input terminal for receiving a first input signal;
a second input terminal for receiving a second input signal;
a write control terminal for receiving a write control signal; and
a logic gate for generating an address signal in response to the first and second input signals and the write control signal.

14. The programmable logic device according to claim 13, wherein the decoder further comprises:
a fourth input terminal for receiving a configuration control signal; and
a write control circuit for passing the address signal to the array in response to the configuration control signal.

15. The programmable logic device according to claim 13,
wherein the programmable elements of the array are arranged in rows and columns, each row of programmable elements being connected to an associated bit line, and each column of programmable elements being connected to an associated word line, and
wherein the address signal generated by the logic gate is transmitted onto a first word line.

16. The programmable logic device according to claim 15, wherein each programmable element of the array comprises:
a latch for storing a bit value; and
a write transistor having a first terminal connected to the bit line, a second terminal connected to the latch, and a gate connected to the word line.

17. The programmable logic device according to claim 15, further comprising a multiplexing/demultiplexing circuit having an output terminal and a data input terminal, the multiplexing/demultiplexing circuit being connected to a first bit line and being selectively controllable to pass a bit value from the first bit line to the interconnect resources in a first mode, and controllable to pass a write bit value from the data input terminal to the first bit line in a second mode.

18. The programmable logic device according to claim 17, wherein the logic/memory circuit further comprises a macrocell circuit for generating a sum-of-products value in response to the plurality of product terms, and wherein the multiplexing/demultiplexing circuit comprises:
a multiplexer circuit for selectively passing the bit value from the first bit line; and
an output control circuit for transmitting either the bit value or the sum-of-products value from the macrocell circuit to the output terminal of the multiplexing/demultiplexing circuit.

19. The programmable logic device according to claim 18,
wherein the multiplexing/demultiplexing circuit further comprises:
a first plurality of two-input multiplexers including a first multiplexer having a first input terminal connected to the first bit line, and a second input terminal connected to a second bit line,
a second plurality of two-input multiplexers including a second multiplexer having an input terminal connected to an output terminal of the first multiplexer and further including a third multiplexer,
a third plurality of two-input multiplexers including a fourth multiplexer having a first input terminal connected to an output terminal of the second multiplexer, and a second input terminal connected to an output terminal of the third multiplexer, and
a fifth multiplexer having an input terminal connected to an output terminal of the third multiplexer; and
wherein the output control circuit comprises a sixth two-input multiplexer for selectively passing a first bit value from one of the second multiplexer and the fourth multiplexer to a first output terminal, and further comprises a seventh two-input multiplexer for selectively passing a second bit value from one of the third multiplexer and the fifth multiplexer to a second output terminal.

20. The programmable logic device according to claim 1,
wherein the decoder generates a first write address signal in response to a first input signal, a second input signal, and a write control signal, and
wherein the array further comprises a hard-wired decode circuit for generating a first read address signal and a second read address signal in response to the first input signal and the second input signal.

21. The programmable logic device according to claim 20, wherein the decoder further comprises:
   a first line for transmitting the first input signal;
   a first inverter for inverting the first input signal;
   a second line connected to the first inverter for transmitting the inverted first input signal;
   a third line for transmitting the second input terminal;
   a second inverter for inverting the second input signal;
   a fourth line connected to the second inverter for transmitting the inverted second input signal;
   a write control terminal for receiving the write control signal; and
   a first logic gate for generating a first write address signal in response to the first and second input signals and the write control signal.

22. The programmable logic device according to claim 21, wherein the decoder further comprises:
   a fourth input terminal for receiving a configuration control signal; and
   a write control circuit for passing the first write address signal to the array in response to the configuration control signal.

23. The programmable logic device according to claim 21, wherein the hard-wired decode circuit further comprises:
   a first read word line connected to one of the first, second, third, and fourth lines for transmitting the first read address signal; and
   a second read word line connected to another of the first, second, third, and fourth lines for transmitting the second read address signal.

24. The programmable logic device according to claim 20,
   wherein the programmable elements of the array are arranged in rows and columns, each row of programmable elements being connected to an associated write bit line and an associated read bit line, each column of programmable elements being connected to an associated write word line and an associated pair of read word lines;
   wherein the first write address signal is transmitted onto a first write word line;
   wherein the first read address signal is transmitted onto a first read word line; and
   wherein the second read address signal is transmitted onto a second read word line.

25. The programmable logic device according to claim 24, wherein each programmable element of the array comprises:
   a latch for storing a bit value;
   a write transistor having a first terminal connected to the write bit line, a second terminal connected to the latch, and a gate connected to the write word line;
   an inverter having an input terminal connected to the latch and further having an output terminal;
   a first read transistor having a first terminal connected to the output terminal of the inverter, a second terminal, and a gate connected to the first read word line; and
   a second read transistor having a first terminal connected to the second terminal of the first read transistor, a second terminal connected to the read bit line, and a gate connected to the second read word line.

26. The programmable logic device according to claim 24, further comprising:
   a read/write control circuit having a first pass transistor connected to a first write bit line, a second pass transistor connected to a first read bit line, and an output terminal connected to the first and second pass transistors; and
   a multiplexing/demultiplexing circuit connected to the output terminal of the read/write control circuit, the multiplexing/demultiplexing circuit having an output terminal and a data input terminal,
   wherein the read/write control circuit and the multiplexing/demultiplexing circuit are selectively controllable to pass a bit value from the first read bit line to the output terminal of the multiplexing/demultiplexing circuit in a first mode, and controllable to pass a write bit value from the data input terminal to the first write bit line in a second mode.

27. The programmable logic device according to claim 26, wherein the logic/memory circuit further comprises a macrocell circuit for generating a sum-of-products value in response to the plurality of product terms, and wherein the multiplexing/demultiplexing circuit comprises:
   a multiplexer circuit for selectively passing the bit value from the first read bit line; and
   an output control circuit for transmitting either the bit value or the sum-of-products value from the macrocell circuit to the output terminal of the multiplexing/demultiplexing circuit.

28. The programmable logic device according to claim 27,
   wherein the multiplexing/demultiplexing circuit further comprises:
      a first plurality of two-input multiplexers including a first multiplexer having a first input terminal selectively connected to the first write bit line and the first read bit line, and a second input terminal selectively connected to a second write bit line and a second read bit line,
      a second plurality of two-input multiplexers including a second multiplexer having an input terminal connected to an output terminal of the first multiplexer and further including a third multiplexer,
      a third plurality of two-input multiplexers including a fourth multiplexer having a first input terminal connected to an output terminal of the second multiplexer, and a second input terminal connected to an output terminal of the third multiplexer, and
      a fifth multiplexer having an input terminal connected to an output terminal of the third multiplexer; and
   wherein the output control circuit comprises a sixth two-input multiplexer for selectively passing a first bit value from one of the second multiplexer and the fourth multiplexer to a first output terminal, and further comprises a seventh two-input multiplexer for selectively passing a second bit value from one of the third multiplexer and the fifth multiplexer to a second output terminal.

29. A programmable logic device including a plurality of configurable logic blocks and interconnect resources for transmitting signals to the configurable logic blocks, each configurable logic block comprising:
   a plurality of input terminals connected to the interconnect resources;
   a first switch circuit for transmitting selected input signals from the plurality of input terminals onto a plurality of input lines;
   a plurality of logic/memory circuits, each logic/memory circuit comprising:

a plurality of input terminals connected to a group of the plurality of input lines for receiving the selected input signals;

a decoder for generating address signals in response to the selected input signals;

an array including programmable elements for storing a plurality of bit values, word lines connected to the decoder for receiving the address signals, and bit lines for transmitting bit values to the programmable elements in response to the address signals;

an input control circuit connected to the input terminals for selectively transmitting the selected input signals onto the bit lines; and a product term circuit connected to the bit lines and to the programmable elements for generating a plurality of product terms in response to the selected input signals transmitted on the bit lines and the bit values stored in the programmable elements.

30. The programmable logic device according to claim 29, wherein each logic/memory circuit further comprises:

a macrocell circuit for generating a sum-of-products value in response to the plurality of product terms;

a data input terminal for receiving a write bit value from the interconnect resources; and a multiplexing/demultiplexing circuit connected to the bit lines and to the macrocell circuit, wherein the multiplexing/demultiplexing circuit is selectively controllable to pass a selected bit value read from a selected bit line to a logic/memory circuit output terminal in a first mode, is controllable to pass the write bit value from the data input terminal to a selected bit line in a second mode, and is controllable to pass the sum-of-products value from the macrocell circuit to the logic/memory circuit output terminal in a third mode.

31. The programmable logic device according to claim 30, wherein each configurable logic block further comprises:

a second switch circuit connected to the logic/memory circuit output terminals and for passing selected bit values from a selected subset of the logic/memory circuit output terminals to a plurality of configurable logic block output terminals;

a register circuit for selectively registering the selected bit values; and a feedback line bus for transmitting the selected bit values to the first switch circuit.

32. The programmable logic device according to claim 30, wherein the first switch circuit comprises a plurality of multiplexer circuits connected to the plurality of input terminals, each multiplexer circuit comprising:

a first plurality of pass transistors, each pass transistor selectively passing one bit value from one input terminal to a first plurality of common nodes;

a second plurality of pass transistors, each pass transistor selectively passing one bit value from one feedback line of the feedback line bus to a second plurality of common nodes; and a third plurality of pass transistors for passing one signal from one of the first plurality of common nodes and the second plurality of common nodes to one of the plurality of input lines.

33. The programmable logic device according to claim 31, wherein each configurable logic block further comprises a special purpose logic circuit connected to receive input signals from the first switch circuit, and connected to transmit output signals to the second switch circuit.

34. The programmable logic device according to claim 33, wherein the special purpose logic circuit is a multiplier circuit.

35. The programmable logic device according to claim 30, wherein each configurable logic block further comprises a programmable array logic circuit.

36. The programmable logic device according to claim 30, wherein each configurable logic block further comprises:

a plurality of configurable logic block output terminals connected to the logic/memory circuit output terminals for passing bit values from the logic/memory circuit output terminals to the interconnect resources;

a feedback line bus for transmitting a first selected subset of the bit values from the configurable logic block output terminals to the first switch circuit; and a register circuit for selectively registering a second selected subset of the bit values transmitted on the configurable logic block output terminals.

37. The programmable logic device according to claim 36, wherein the first switch circuit comprises a plurality of multiplexer circuits connected to the plurality of input terminals, each multiplexer circuit comprising:

a first plurality of pass transistors, each pass transistor selectively passing one bit value from one input terminal to a first plurality of common nodes;

a second plurality of pass transistors, each pass transistor selectively passing one bit value from one feedback line of the feedback line bus to a second plurality of common nodes; and a third plurality of pass transistors for passing one signal from one of the first plurality of common nodes and the second plurality of common nodes to one of the plurality of input lines.

* * * * *